(12) United States Patent
Carley

(10) Patent No.: US 6,664,832 B2
(45) Date of Patent: *Dec. 16, 2003

(54) ARBITRARY WAVEFORM SYNTHESIZER USING A FREE-RUNNING RING OSCILLATOR

(75) Inventor: Adam L. Carley, Windham, NH (US)

(73) Assignee: TimeLab Corporation, North Andover, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/131,606

(22) Filed: Apr. 24, 2002

(65) Prior Publication Data

US 2002/0190760 A1 Dec. 19, 2002

Related U.S. Application Data

(63) Continuation of application No. 09/607,078, filed on Jun. 29, 2000, now Pat. No. 6,377,094.

(51) Int. Cl.[7] .................. H03B 21/00; H03K 3/84
(52) U.S. Cl. ............. 327/164; 327/105; 327/107; 331/57
(58) Field of Search .................. 327/164, 105, 327/107, 157, 156, 141; 331/57

(56) References Cited

U.S. PATENT DOCUMENTS 6,025,745 A * 2/2000 Lee et al. .................. 327/262

* cited by examiner

*Primary Examiner*—Dinh T. Le
(74) *Attorney, Agent, or Firm*—Brian M. Dingman, Esq.; Mirick, O'Connell, DeMallie & Lougee, LLP

(57) ABSTRACT

The waveform generator includes a free-running ring oscillator, an algebra module, a switching module and an output module. The free-running ring oscillator includes a plurality of delay elements connected in a loop and a plurality of taps disposed between the delay elements, with each tap providing a uniquely phased, oscillating transition signal. The algebra module generates an output signal indicating a first rising edge of the arbitrary waveform in response to an input signal. The switching module includes a switch input port in electrical communication with the algebra data output port, a plurality of switch tap input ports in electrical communication with the free-running ring oscillator taps and switch output port. At the switch output port, the switch module provides a first transition signal selected from one of the plurality of free-running ring oscillator taps in response to the signal indicative of a first rising edge received at the switch input port. The output module has a transition signal input port in electrical communication with the switch output port, a window input port in electrical communication with the algebra data output port and a waveform output port in electrical communication with the clock input port of the algebra module. The output module creates an arbitrary waveform at the waveform output port in response to the first transition signal received at the transition signal input port of the output module and the signal of a first rising edge received at the window input port.

1 Claim, 24 Drawing Sheets

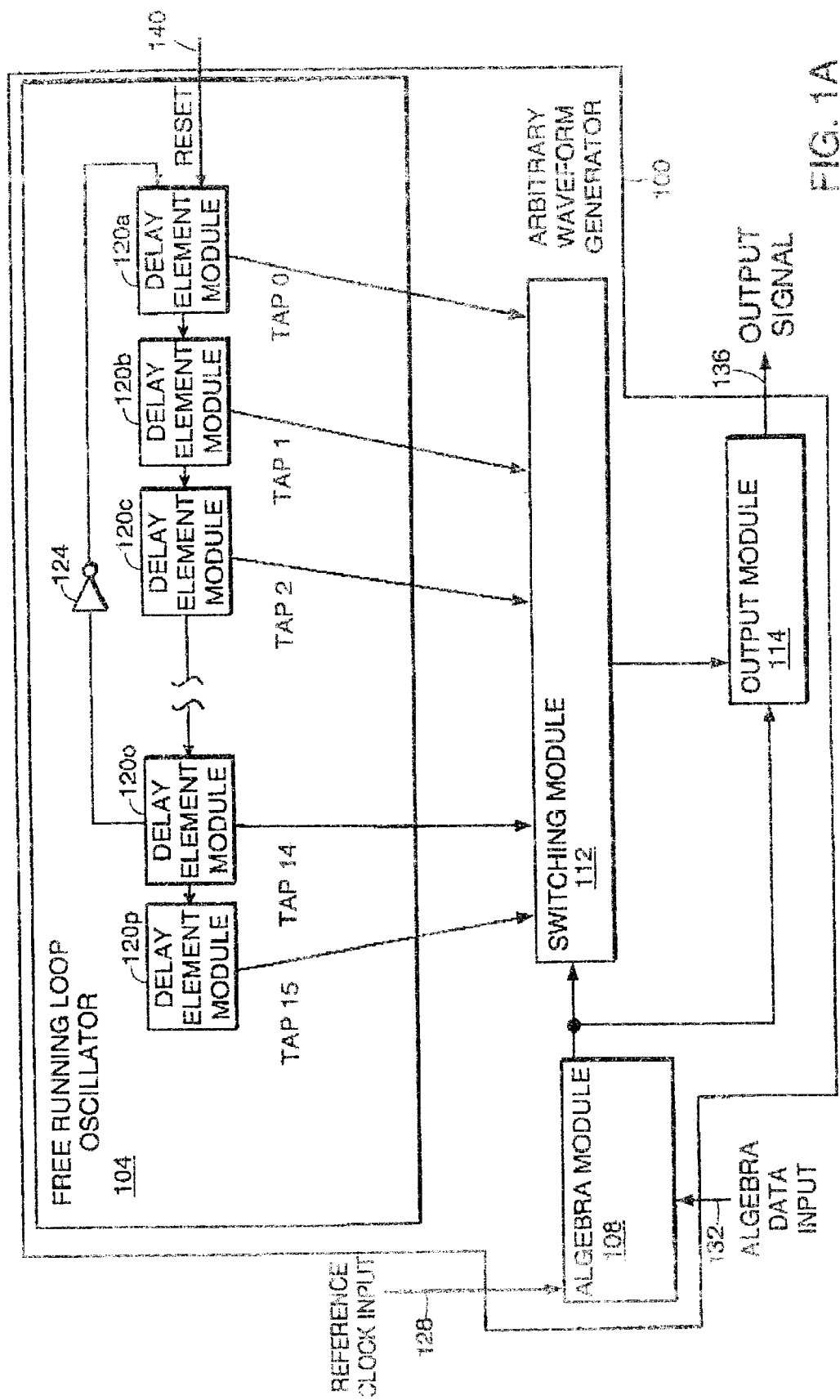

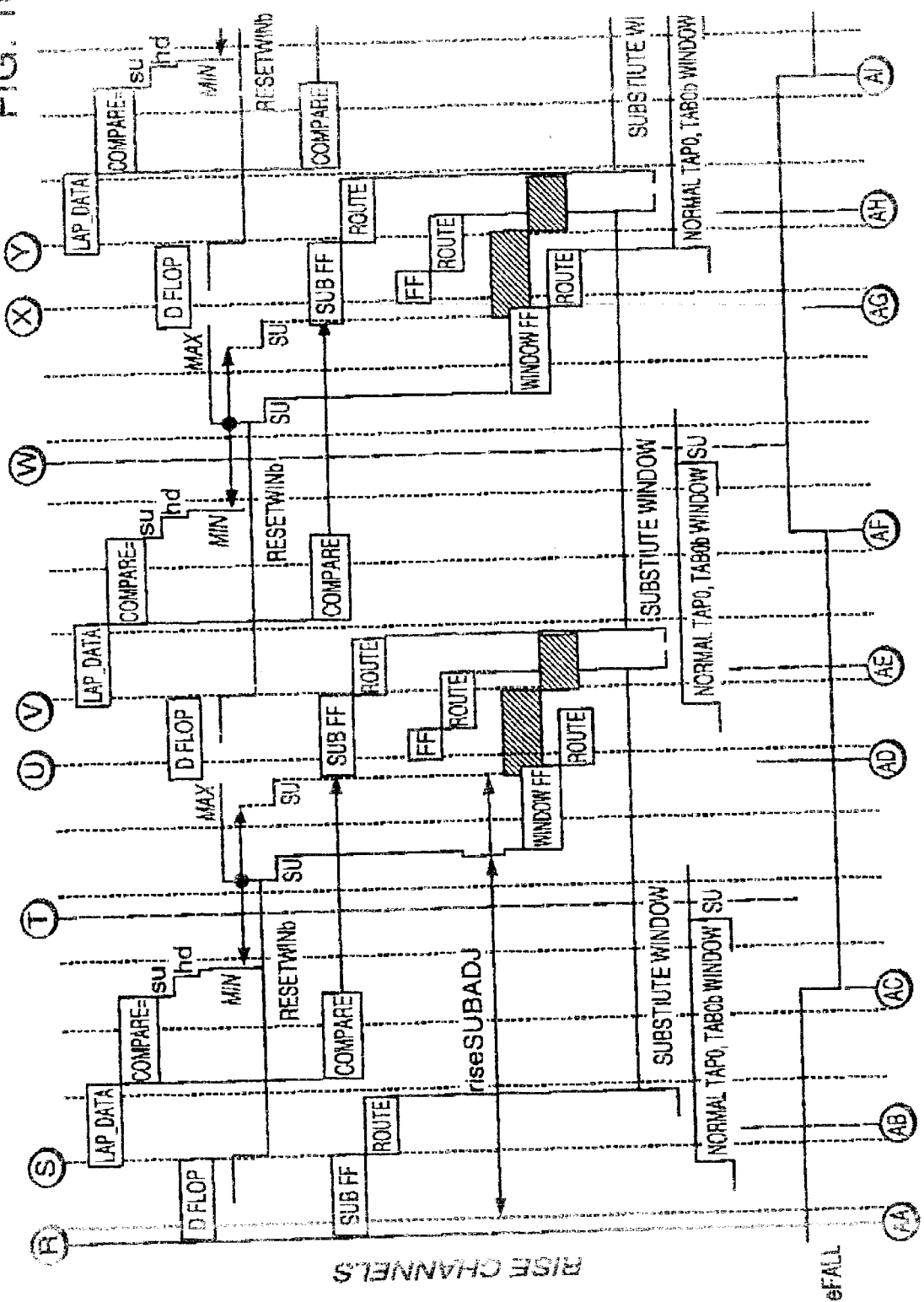

ARBITRARY WAVEFORM SYNTHESIZER USING A FREE-RUNNING RING OSCILLATOR

This is a continuation of application Ser. No. 09/607,078 filed Jun. 29, 2000 now U.S. Pat. No. 6,377,094.

FIELD OF THE INVENTION

This invention relates generally to the field of waveform generation. More specifically, the invention relates to a method and apparatus for generating an arbitrary waveform using a free-running ring oscillator.

BACKGROUND OF THE INVENTION

There are many instances when it is desirable to inexpensively divide units of time or units of distance into smaller units. For example, in a range detector, the time elapsed between the outgoing signal and the incoming signal may be very short, on the order of nanoseconds, and the use of a standard reference clock to count the time elapsed would yield an inaccurate count resulting in inaccurate distance calculations.

In another example, in laser printers, it is often desirable to provide a transition from white to black (or vice versa) at various distances within a given line cell for high resolution. See U.S. Pat. No. 5,109,283 incorporated herein by this reference. A white-to-black or black-to-white signal, however, clocked at the printer's pixel clock rate of 10 MHz, is not resolved finely enough at the printer's laser diode to accurately control print transitions within a given print cell. Faster clocks are too expensive and/or not available to reference the print transitions at the high temporal resolution (e.g., one nanosecond corresponding to print cell distances on the order of microns) required for high resolution graphic images.

One solution to the above problems is to use a device incorporating a free-running ring oscillator (also referred to interchangeably as a loop oscillator). U.S. Pat. Nos. 5,793,709 and 5,903,522 describe such solutions, and are herein incorporated by this reference. However, as signal requirements for applications in the fields of CD-RW, DVD, communications and radar demand transition edges of higher frequency and precision, limitations are realized. Differences in circuit conductive path lengths and implementation hardware become noticeable. An algebra clock based on the frequency of the reference clock limits the speed of the calculations made by the algebra circuitry. External circuitry calculating the speed of the free-running loop oscillator ("loop") also limits the speed of the calculations made by the algebra circuitry. Devices using the output may not tolerate a sudden, unpredictable transition in the output signal when a synchronization signal is used.

The present invention addresses these needs.

SUMMARY OF THE INVENTION

It is therefore an object of this invention to compensate for different implementation hardware and unequal path lengths. Another object of this invention is to generate an internal clock for the transition edge calculations based on the output signal being generated, which can be substantially faster than the reference clock. The invention also includes a watchdog for supplying the internal clock should the transition edge calculations become erroneous. Another object of this invention is to internally calculate the average loop speed in order to increase the overall allowable frequency of the calculation. The circuitry also calculates the transition position in the loop based on the average loop speed to improve accuracy. Another object of this invention is to generate an output that seamlessly joins an updated output waveform with a previous output waveform upon an intentional change in the output phase. Applications in the fields of CD-RW, DVD, communications and radar require faster and more precise edge transitions.

This invention relates to a method and apparatus for generating an arbitrary waveform. In one aspect, the invention relates to a waveform generator for generating an arbitrary waveform. The waveform generator includes a free-running ring oscillator, an algebra module, a switching module and an output module. The free-running ring oscillator includes a plurality of delay elements connected in a loop and a plurality of taps disposed between the delay elements, with each tap providing a uniquely phased, oscillating transition signal. The algebra module includes an algebra data input port, a clock input port and an algebra data output port. The algebra module generates a signal at the algebra data output port indicating a first rising edge of the arbitrary waveform in response to a signal received at the algebra data input port. The switching module includes a switch input port in electrical communication with the algebra data output port, a plurality of switch tap input ports in electrical communication with the free-running ring oscillator taps and switch output port. At the switch output port, the switch module provides a first transition signal selected from one of the plurality of free-running ring oscillator taps in response to the signal indicative of a first rising edge received at the switch input port. The output module includes a transition signal input port in electrical communication with the switch output port, a window input port in electrical communication with the algebra data output port and a waveform output port in electrical communication with the clock input port of the algebra module. The output module creates an arbitrary waveform at the waveform output port in response to the first transition signal received at the transition signal input port of the output module and the signal of a first rising edge received at the window input port.

In one embodiment, the arbitrary waveform generator includes a loop averaging module, which includes a reference clock input port and a tap input port, which is electrically connected to the plurality of taps in the free-running ring oscillator. In response to a reference clock signal received at the reference clock input port, the loop averaging module counts the number of tap transitions occurring between edges of the reference clock signal and calculates an average loop speed in response to the count. The loop averaging module can further calculate the instantaneous phase of the ring oscillator in response to the calculated average loop speed and a plurality of captured states of the loop.

In another embodiment, the arbitrary waveform generator includes a fine delay module. The fine delay module includes a signal input port in electrical communication with the switch output port, a selection input port in electrical communication with the algebra data output port of the algebra module and a fine-delay output port in electrical communication with the input port of the output module. The fine delay module delays the propagation of the first transition signal from the switch output port of the switching module to the input port of the output module in response to the signal of a first rising edge received at the selection input port. The selection input port of the output module is in electrical communication with the switch output port of the switching module through the fine delay module.

In another embodiment, the algebra module includes a synchronization input port. In response to signals received at the algebra data input port and the synchronization input port, the algebra module, at the algebra data output port, creates a signal of a first rising edge within the arbitrary waveform. The algebra module then generates a signal of a first rising edge that results in a seamless incorporation of the first rising edge in the arbitrary waveform generator.

In another embodiment, one of the delay elements is an inverting delay element, with each delay element being identically loaded. In another embodiment, at least one delay element includes a test switch module. The test switch module has a test control input port and a test data input port. In response to a signal received at the test control input port, the delay element, at the corresponding tap, creates a signal identical to the signal received at the test data input port.

In another embodiment, the arbitrary waveform generator also includes a compensation module. The compensation module includes a data output port in electrical communication with the algebra module and a compensation input port to receive a signal indicative of a frequency altering parameter of a source of a reference clock. The compensation module estimates a variation in frequency of the reference clock associated with the frequency altering parameter of the source of the reference clock. The compensation module then creates a correction signal at the compensation output port in response to this frequency variation. In another embodiment, the frequency altering parameter is the temperature of the source of the reference clock. In another embodiment, the frequency altering parameter is the age of the source of the reference clock.

In another embodiment, the algebra module is made to create a second signal of the first falling edge within the arbitrary waveform at the algebra data output port in response to a signal received at the algebra input port. In another embodiment, the output module is made to create a catch-up signal of an erroneous signal of a first rising edge received at the window input port. In another embodiment, the arbitrary waveform generator is implemented within a CMOS integrated circuit.

In another embodiment, the arbitrary waveform generator includes an amplifier and a loop-speed compensator circuit. The amplifier feeds forward at least one component of powersupply noise from a power supply coupled to the ring oscillator and the loop-speed compensator circuit is in electrical communication with the amplifier. In one embodiment, the loop-speed compensator circuit is in electrical communication with the loop averaging module to adjust the calculated average loop speed in response to the amplified noise. In another embodiment, the loop-speed compensator circuit is in electrical communication with the algebra module to adjust the calculated average loop speed in response to the amplified noise.

In another embodiment, the arbitrary waveform generator includes a plurality of capacitive elements each of which is in electrical communication with a respective one of a plurality of signal paths. Each capacitive element has a respective predetermined capacitance to create a respective predetermined time delay in the propagation of a transition signal through the respective signal path such that the propagation time for a transition on a first signal path is substantially equal to the propagation time for a transition on a second signal path.

In another embodiment, each capacitive element of the plurality of capacitive elements has a value less than approximately 50 femtofarads. In a further embodiment, each of the plurality of signal paths is in electrical communication with a first capacitive element and a second capacitive element. In a further embodiment, the first and second capacitive elements have different sensitivities to temperature, process and supply voltage.

In another aspect, the invention relates to a method for creating an arbitrary waveform. The method of creating an arbitrary waveform includes generating a continuous sequence of transitions in a loop of delay elements, counting the transitions occurring at one of the delay elements in the loop, determining a desired first rising edge time and a first falling edge time, selecting a first transition in the continuous sequence of transitions in response to the desired first rising edge based on the counted transitions and an internal clock, selecting a second transition in the continuous sequence of transitions in response to the desired first falling edge time based on the counted transitions and an internal clock, generating an output signal using the first and second selected transitions, and generating the internal clock signal based on the output signal.

In one embodiment, the method of generating an output signal includes using each of the transitions of the continuous sequence of transitions to generate the output signal in response to the desired first rising edge time occurring in the past.

In another embodiment, the method includes the calculation of the average rate of transitions at one of the delay elements with respect to an input reference clock.

In another embodiment, the method includes the calculation of the instantaneous phase within the loop of delay elements in response to the calculated average rate of transitions and a plurality of captured states of the loop of delay elements.

In another embodiment, the method includes adding to the selected transition one of a plurality of propagation delays, where the difference between two of the plurality of propagation delays is less than the average propagation time of a transition through a delay element in the loop of delay elements.

In another embodiment, the method includes receiving an external synchronization signal and modifying the selection of the first and second transitions in response to the received synchronization signal. In a further embodiment, the modification process includes adjusting the selection of the first transition so there is a seamless incorporation of the first rising edge in the output signal to create the arbitrary waveform.

In another embodiment, each transition has a polarity. In a further embodiment, generating a continuous sequence of transitions includes inverting the polarity of a transition with a delay element. In a further embodiment, the generation of a continuous sequence of transitions provides an identical load to each of the delay elements.

In another embodiment, the method includes receiving a signal indicative of a frequency altering parameter of a source of a reference clock, determining any variation of the reference clock due to the frequency altering and altering the selection of the first transition in response to the determined variation. In another embodiment, the frequency altering parameter is a temperature of the source of the reference clock. In another embodiment, the frequency altering parameter is an age of the source of the reference clock.

In another embodiment, the method includes the addition of a predetermined time delay to the propagation of a transition through a respective signal path such that the propagation time for a transition through the signal path is substantially equal to the propagation time for a transition through a second signal path.

BRIEF DESCRIPTION OF THE DRAWINGS

Other objects, features and advantages will occur to those skilled in the art from the following description of a preferred embodiment and the accompanying drawings, in which:

FIG. 1A is a high level block diagram of one embodiment of the invention;

DETAILED DESCRIPTION OF PREFERRED EMBODIMENTS

Figure 1B:
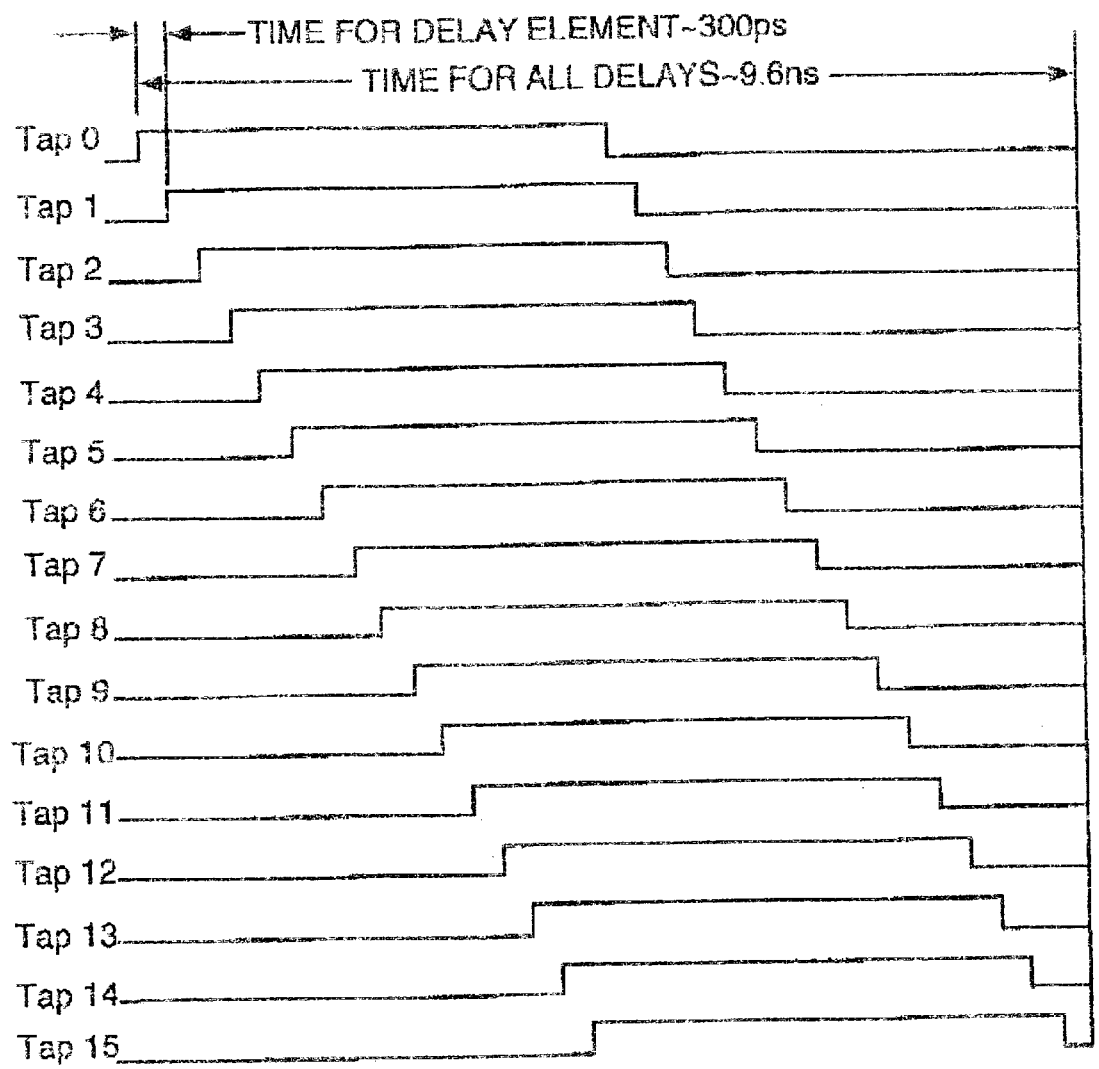
FIG. 1B is a timing diagram of the signals from the taps of the free-running loop oscillator shown in FIG. 1A.

FIG. 1A depicts, at a high level, an arbitrary waveform generator 100 used to create an output signal 136. The arbitrary waveform generator 100 includes a free-running loop oscillator 104, a switching module 112, an algebra module 108 and an output module 114. The loop 104 is electrically connected to the switching module 112, via taps, for transmitting transition edges to arm the switching module 112. The algebra module 108 receives an external reference clock signal 128 and an algebra data input signal 132. Using these signals 128, 132, the algebra module 108 calculates, as described in more detail below, which transition edge is to be selected from the taps to generate the next transition edge of the output signal 136. The algebra module 108 is electrically connected to the switching module 112 and the output module 114 for transmitting the calculated transition edge used to generate the output signal 136. The switching module 112 receives the transition edge information from the algebra module 108 and selects the tap of the loop 104 that corresponds to the calculated transition edge. The switching module is electrically connected to the output module 114 for transmitting the transition edge from the selected tap to the output module 114. The output module receives the transition edge and provides it as an output signal 136.

The free-running loop oscillator 104 includes an input for an external reset signal 140, a series of delay element modules 120a, 120b, 120c, 120o, 120p (generally 120) and at least one inverting element 124. This reset signal 140 has two states, a reset state and a run state. While the signal 140 is in the reset state, the loop 104 does not oscillate. When the signal 140 transitions to the run state, the loop 104 begins to oscillate. The transition propagates through the first delay element module 120a to the input of the next delay element module 120b. Shortly after a signal is received at the input of a delay element module 120, the signal is output on the corresponding tap.

For example, some time after a transition propagates to the input of delay element module 120a, it also appears on tap 0. As the transition propagates to the output of the delay element module 120a and subsequently to the input of the next delay element module 120b, it also appears on tap 1. This process is repeated as the transition progresses all the way to the last delay element module 120p and tap 15. The exemplary embodiment of FIG. 1A depicts 16 taps. The number of taps can vary. The number of taps is chosen by design consideration and, in part, depends on the desired frequency, available implementation hardware and speed of algebra module calculation.

The exemplary embodiment of FIG. 1B depicts the transitions as they appear on the corresponding taps of FIG. 1A. As shown in FIG. 1B, there is a delay of approximately 300 picoseconds between each transition on each tap. This delay time represents the time it takes the transition to propagate from the input of the delay element module 120 to the output of the corresponding tap. This delay time is dependent on the hardware used to implement the design. The embodiment shown was implemented on an ASIC in 0.35 micron process. An ASIC in 0.25 micron process can yield a delay time that is approximately one half the delay time of the ASIC in 0.35 micron process. With a smaller the delay time, the algebra module 108 calculates a more precise placement of a transition edge in the output signal 136. The delay time is chosen by design consideration, depending on the desired frequency, available implementation hardware and speed of algebra module calculation.

In another embodiment, each delay element module 120 contains an inverting element. The inverting elements cause every other tap to transition in the opposite direction for a single edge propagation around the loop. For example, tap 1, tap 3, tap 5, tap 7, tap 9, tap 11, tap 13 and tap 15 each transition from a high state to a low state, instead of from a low state to a high state as shown in FIG. 1B. Use of inverting elements result in more consistent propagation times around the loop because the propagation time of a positive transition is different than the propagation time of a negative transition. Also, the inverting elements result in more uniform loading of the power supply.

Figure 2:
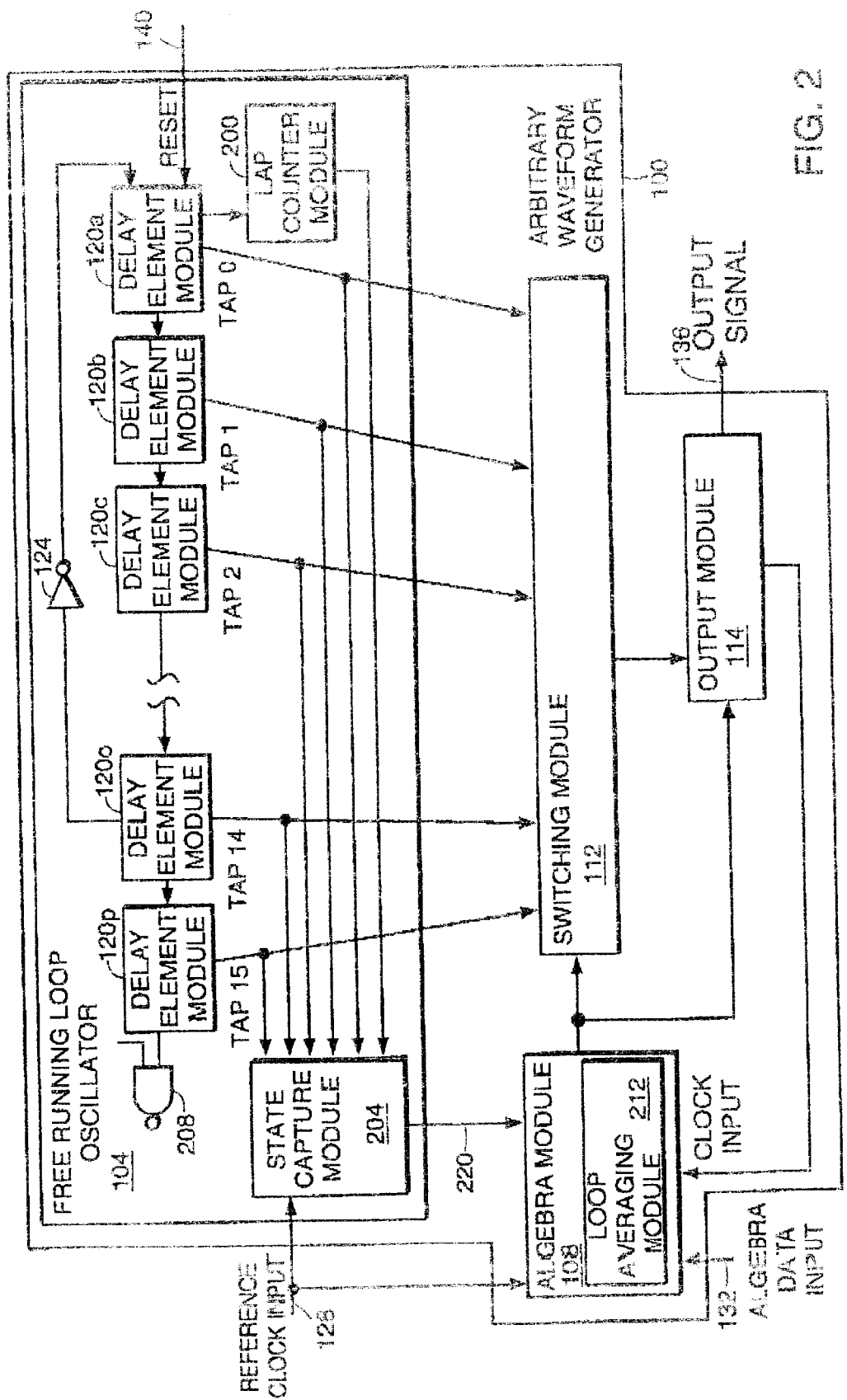
FIG. 2 is a high level block diagram of one embodiment of the invention depicting additional modules.
Figure 3:
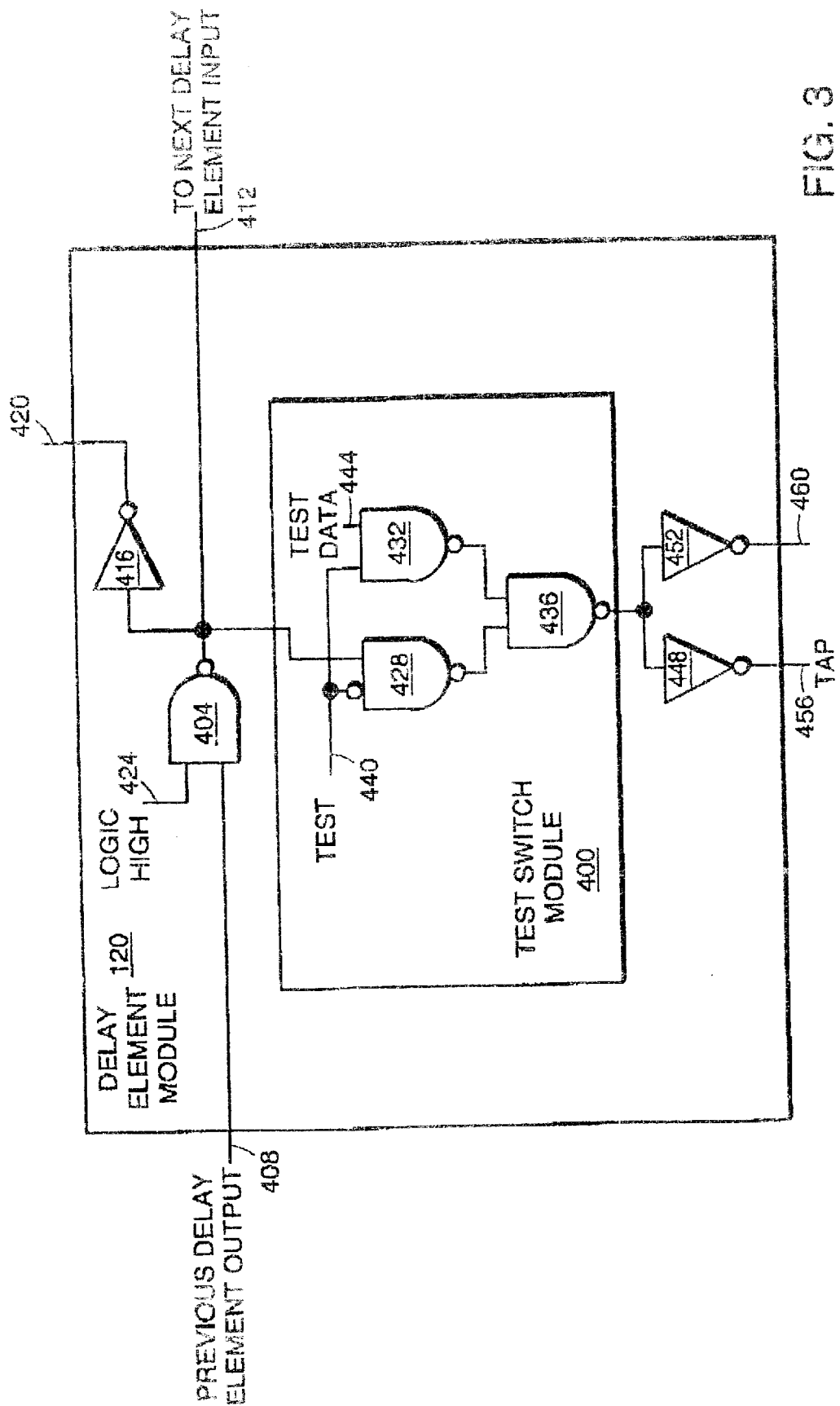
FIG. 3 is a detailed block diagram of one embodiment of the delay element module shown in FIG. 2.

Referring to FIG. 2, the transition propagates through the series of delay element modules 120a to 120p. Upon reaching the output of the last delay element module 120*p*, the transition has completed one loop (also referred to as a lap). The exemplary embodiment of the loop 108 includes an inverting logic element 208 connected to the output of the last delay element module 120*p*. This inverting logic element 208 is similar to an inverting logic element 404 (FIG. 3) included in each delay element module 120 connected to the output of the preceding delay element module 120. This ensures that the output of the last delay element module 120*p* is loaded similarly to the other delay element modules 120*a* to 120*o* so that the time between transitions on each tap is similar. Tolerances of hardware implementation also can determine how equal the delay times can be.

To create the "looping" effect, the propagation of transitions through the series of delay element modules 120*a*, 120*b*, 120*c*, 120*o*, 120*p* must be repeated. To accomplish this, one transition is selected (e.g., from delay element module 120*o*) and sent through an inverting element 124 back to the input of the first delay element module 120*a*. The number of inverter elements 124 used depends on whether the delay element module 120 selected (e.g., delay element module 120*o*) outputs a transition in the opposite direction of the first delay element module 120*a*.

For example, if the first delay element module 120*a* previously transitioned from low to high and the selected transition (e.g., delay element module 120*o*) also transitioned from low to high, there must be one inverter 124 in the path to cause the transition transmitted to the input of the first delay element module 120*a* to be from high to low. If the embodiment had delay element modules 120 that included inverter elements and the selected transition was already inverted with respect to the first delay element module 120*a*, two inverter elements 124, 124' (not shown) are used in series to ensure that the opposite transition was transmitted to the first delay element 120*a*. The delay element module 120*o* connected to the inverter 124 is selected so that the propagation time of the transition from the selected delay element module 120*o* to the first delay element module 120*a*, via the inverter element(s) 124, is approximately equal to the propagation time of the transition from the selected delay element module 120*o* to the output of the last delay element module 120*p*.

For an illustrative example, each delay element module 120 includes inverting elements. The propagation time through two inverting elements 124, 124' (not shown) equal the propagation time of two delay element modules 120. The delay element module 120*n* (not shown) corresponding to tap 13 is selected. Delay element module 120*n* is the opposite transition of the first delay element module 120*a*, so two inverting elements 124, 124' are required to ensure the correct polarity. The timing is also correct so that the time the transition propagates from tap 13 to tap 15, the transition also arrives at the input of the first delay element module 120*a* via the two inverting elements 124, 124'.

As shown in FIG. 2, the loop 104 also includes a lap counter module 200 and a state capture module 204. The algebra module 108 also includes a loop averaging module 212. The lap counter module 200 is electrically connected to the first delay element module 120*a* for receiving transition edges as they propagate through the delay element module 120*a*. The lap counter module 200 is electrically connected to the state capture module 204 for transmitting the number of laps stored. The state capture module 204 receives a reference clock signal 128. The state capture module 204 is electrically connected to each of the taps and the lap counter module 200 for receiving and storing the states of the loop 104 taps and lap counter module 200 at a reference clock signal 128 transition. The state capture module 204 is also electrically connected to the algebra module 108 for transmitting the stored state information 220. The loop averaging module 212 receives the transmitted stored state information 220 from the state capture module 204 and calculates the average loop speed used in the algebra module 108 calculations.

The lap counter 200 includes two counters. A positive edge counter 200*a* (not shown) counts one each time a positive edge transition (e.g. transition from logic low to high) propagates through the first delay element module 120*a*. A negative edge counter 200*b* (not shown) counts one each time a negative edge transition (e.g. transition from logic high to low) propagates through the first delay element module 120*a*. Thus the negative edge counter 200*b* is 180 degrees out-of-phase with the positive edge counter 200*a*. Two counters 200*a*, 200*b* are used to ensure that even if one counter is being updated, the other modules of the arbitrary waveform generator 100 have access to a stable and accurate counter to determine the lap number. The size (i.e., number of bits) of each counter can vary and is chosen by design consideration, depending on the desired frequency, available implementation hardware and speed of algebra module calculation. Each counter keeps counting and, upon reaching its maximum value, rolls over to zero and continues counting.

The state capture module 204 includes a register 204*a* (not shown) that uses the reference clock signal 128 as its clock. Upon a transition of the reference clock signal 128 (typically a positive edge transition), the register 204*a* stores (also referred to as captures) the state of the loop 104. In one embodiment, the register 204*a* stores a 16 bit data word. In this embodiment, 11 bits are used for the value of the lap counter 200. Four bits are used to represent 16 taps. These four bits are used for the state of the taps, representing the last tap that the transition propagated through at the time of the capture. One bit is used to represent the state of the transition (i.e., positive edge or negative edge) as it passed through the first delay element module 120*a*. This bit is needed for determining whether the transition edge selected by the algebra module 108 is a positive edge or a negative edge and needs to be inverted by the switching module 112.

The delay element modules 120 create the transition edges that are outputted to the taps and captured. One of the delay element modules 120 is shown in more detail in FIG. 3. The delay element module 120 includes a NAND element 404. The two inputs 408, 412 of the NAND element 404 receive signals from the previous delay element module 120 output and a logic high signal 424, respectively. The logic high signal ensures that the output of the NAND element 404 is the inverted signal of the input signal 408 from the output of the previous delay element module 120.

For the first delay element module 120*a* (FIG. 2), the logic high signal is replaced by the reset signal 140 and the input signal 408 is received from the inverting output element 124, not a previous delay element 120. When the reset signal 140 is in the reset state, a logic low, the output of the NAND element 404 is a logic high, regardless of the input signal 408. The rest of the delay element modules 120*b* to 120*p* (FIG. 2) of the free running loop oscillator 104' are driven to their corresponding states and the loop 104 stays in that reset state until the reset signal transitions to the run state, a logic high.

The output 412 of the NAND element 404 is sent to the next delay element module 120. The output 412 also is an input to an inverter 416. The transition from the inverter output 420 for one selected delay element module 120 (e.g., delay element module 120o, FIG. 2) is sent to another inverter 124 (FIG. 2) and then to the first delay element module 120a to maintain oscillation of the loop 104. For the other delay element modules 120a, 120b, 120c, 120p, the output 420 is not connected. In one embodiment, the inverter 416 is included in each of the delay element modules 120, whether connected or not, for load balancing purposes. As discussed above, keeping the loads of the delay element modules 120 as similar and equal as possible keeps the propagation times through each delay element module 120 consistent.

The output 412 of the NAND element 404 is connected to a test switch module 400. The test switch module 400 receives a test input signal 440. The state of this signal 440 determines the signal generated by test switch module 400. For example, if the test input signal 440 is in a NOT test state (e.g., logic low), NAND element 428 outputs a signal having the opposite state of the output 412 of the NAND element 404. The NAND element 432 outputs a logic high, regardless of the test data input signal 444. Thus the NAND element 436 outputs the opposite state of the output of the NAND element 428, which is the same as the state of the output 412 of the NAND element 404. If the test input signal 440 is in a test state (e.g., logic high), the NAND element 428 outputs a logic high, regardless of the output 412 of the NAND element 404. The NAND element 432 outputs the opposite state of the test data input signal 444. Thus the NAND element 436 outputs the opposite state of the output of the NAND element 432, which is the same state as the test data input signal 444.

An inverting driver 448 amplifies the output of the NAND element 436, which is the output of the test switch module 400. The output of the inverting driver 448 is the tap signal 456 that is sent to the switching module 112 (FIG. 2). Thus depending on the state of the test input signal 440, the output of the inverting driver 448 is the opposite state of either the output of the NAND element 404 or the test data input signal 444.

For the first delay element module 120a, the output of the NAND element 436 also is an input to an inverting driver 452. The output of the inverting driver 452 is connected to the lap counter module 200. The lap counter counts each transition that is output from the inverting driver 452. For the other delay element modules 120b to 120p, the output of the inverting driver 452 is not connected. In one embodiment, the inverting driver 452 is included in each of the delay element modules 120, whether connected or not connected, for load balancing purposes.

Figure 4:
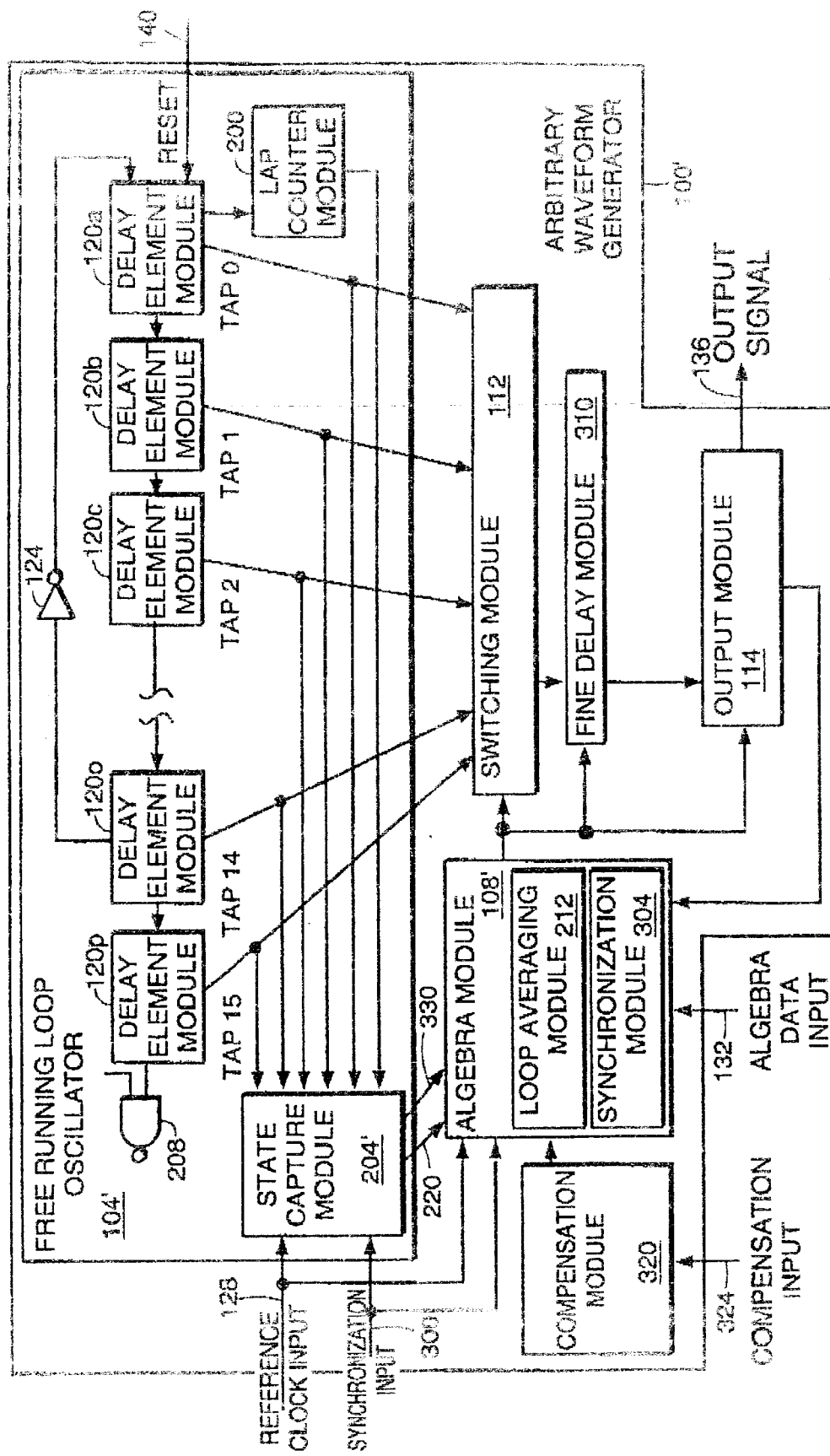
FIG. 4 is a high level block diagram of another embodiment of the invention.

FIG. 4 depicts an alternate embodiment of an arbitrary waveform generator 100'. The arbitrary waveform generator 100' further includes a fine delay module 310, a compensation module 320, a free running loop oscillator 104' that includes a state capture module 204' and an algebra module 108' that includes a synchronization module 304. The fine delay module 310 is electrically connected to the switching module 112 for receiving the transition edge. The fine delay module 310 adds a differential delay to the transition edge that is smaller than the propagation delay time through a delay element module 120. The fine delay module 310 is electrically connected to the output module 114 for transmitting the further delayed transition edge to the output module 114. The compensation module 320 receives a compensation input signal 324. The compensation module is electrically connected to the algebra module 108' for transmitting an adjustment signal.

In one embodiment, the compensation module 320 receives a compensation input signal 324 representing the temperature of the oscillator creating the reference clock input signal 128 (i.e., the source of the reference clock 128). The compensation module 320 determines the variance of the frequency of the reference clock 128 based on the compensation input signal 324, using a predetermined relationship of temperature to frequency (e.g., a look-up table). The compensation module 320 outputs the adjustment signal, with the variance information, to the algebra module 108'. The variance, in terms of a reference clock 128 period delta, is algebraically added to the desired output period 132 to produce an ultra-stable time reference as the output signal 136 without an oven or a warm up delay.

In another embodiment, crystal aging may also be corrected in a similar manner by utilizing an age indicator signal (e.g., the current date) as the compensation input signal 324. The compensation module 320 determines the variance of the frequency of the reference clock 128 based on the compensation input signal 324, using a predetermined relationship of age to frequency (e.g., a look-up table).

The state capture module 204' receives a synchronization input signal 300. The state capture module 204' is electrically connected to each of the taps and the lap counter module 200 for receiving and storing the states of the loop 104' taps and lap counter module 200 at a synchronization signal 300 transition. The state capture module 204' includes a second register 204b (not shown) that uses the synchronization signal 300 as its clock. Upon a transition of the synchronization signal 300 (typically a positive edge transition), the second register 204b stores the state of the loop 104'. In one embodiment, the second register 204b stores a 16 bit data word, the bits being used as described for the first register 204a.

The state capture module 204' is also electrically connected to the algebra module 108' for transmitting the stored state information 330. The synchronization module 304 of the algebra module 108' receives the transmitted stored state information 330 from the state capture module 204' and calculates the selection of subsequent transition edges so the output signal 136 is in phase with the synchronization signal 300.

Figure 5:
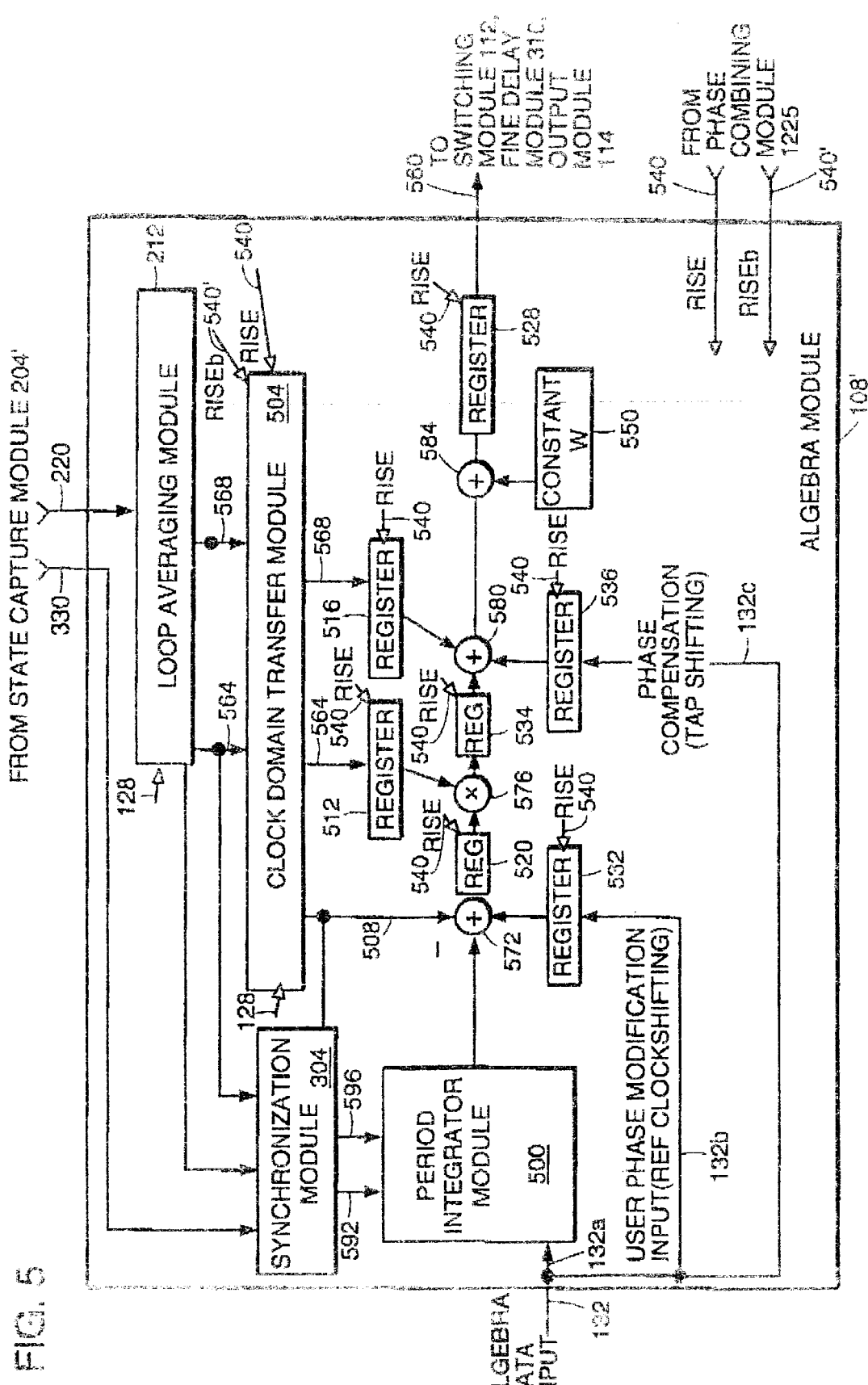
FIG. 5 is a detailed block diagram of one embodiment of the algebra module of the invention.

FIG. 5 depicts the algebra module 108' in more detail. The algebra module 108' calculates the lap and tap that is needed from the loop 104' to create each transition edge of the output signal 136. In one embodiment, a four channel algebra module 108' calculates the next two rising edges and the corresponding falling edges of the output signal 136. The first rising edge is referred to as the phase 0 signal, the corresponding falling edge is referred to as the phase 1 signal, the second rising edge is referred to as the phase 2 signal and the corresponding falling edge is referred to as the phase 3 signal. For clarity the figures, except as noted, depict the circuitry for creating the phase 0 signal. The circuitry for the other three phase signals is similar, unless otherwise noted. By calculating four edges in parallel, the algebra module 108' operates at a faster frequency, thus allowing the output signal 136 to be a higher frequency. In other embodiments, more or less than four channels are required depending on the required performance.

The algebra module 108' receives the reference clock 128 and the RISE clock 540. The RISE clock 540 is received from the phase combining module 1225 (FIG. 12) of the output module 114. The RISE clock 540 is half the frequency of the output signal 136 and has edges corresponding to the rising edges of the output signal 136. The algebra module 108' uses the RISE clock 540 as the clock for performing calculations and storing data in registers. The algebra module 108' also receives an algebra data input signal 132. The algebra data input signal 132 includes a data word 132a that represents a multiplier of the period of the reference clock input signal 128, the product of which defines the desired period of the output signal 136.

In one embodiment, the data word 132a is a 27 bit word, where the first 6 bits represent the integer of the multiplier and the other 21 bits represent the fraction of the multiplier. Using 27 bits allows the user to define the frequency of output signal 136 to better than 1 ppm precision. For example, for an output signal 136 that is half the period of the reference clock input 128 (i.e., twice the frequency), the data word 132a is 000000.100000000000000000000. For an output signal 136 that is one-quarter the period of the reference clock input 128 (i.e., four times the frequency), the data word 132a is 000000.010000000000000000000. In another example, an output signal 136 that is 2.25 times the period of the reference clock input 128 (i.e., 0.444444 . . . times the frequency), the data word 132a is 000010.010000000000000000000.

Figure 6:
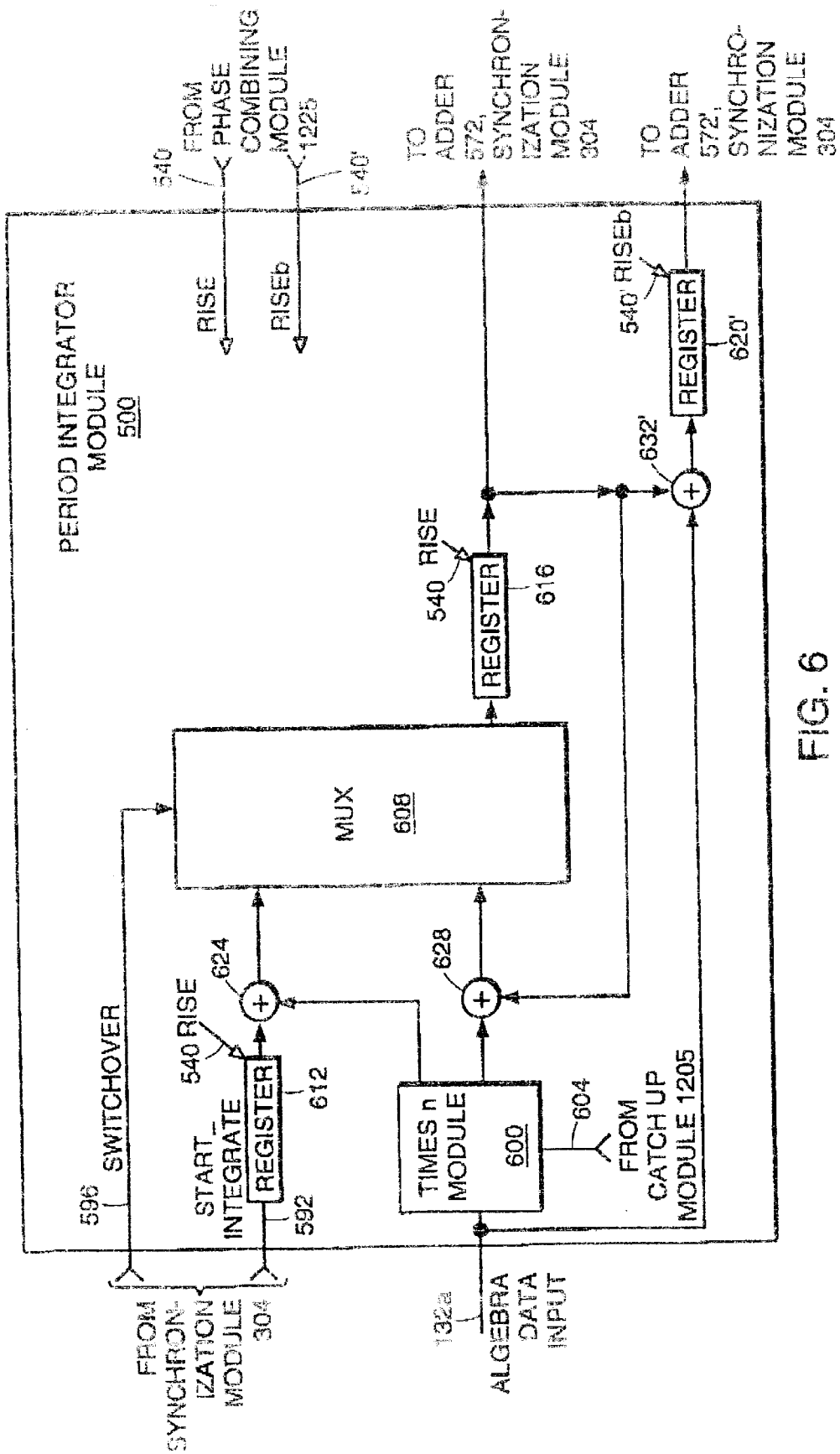
FIG. 6 is a detailed block diagram of one embodiment of the period integrator module shown in FIG. 5.

The multiplier data word 132a is used by the period integrator module 500 to determine when the next rising edge occurs relative to the reference clock signal 128. FIG. 6 depicts the period integrator module 500 in more detail. The multiplier data word 132a is input into two components, the times n module 600 and the adder 632'. The multiplier data word 132a is used by these components 600, 632' to calculate the desired transition for the first rising edge, phase 0, and the second rising edge, phase 2, respectively, in terms of the reference clock signal 128. The times n module 600 multiplies the multiplier data word 132a by a constant in one embodiment, hardwired in the IC. The constant is different for different conditions, as described below. The constants used are determined by design requirements.

In an illustrative example, the chosen constants are two (for normal conditions), six (for catch-up mode) and eleven (for synchronization mode). Under normal conditions, the times n module 600 multiplies the multiplier data word 132a by two because the phase 0 calculation calculates every other rising edge. "Catch-up", as described below, is a mode where the algebra module 108' has somehow miscalculated and requests a needed edge that has already occurred. As a result, the catch-up module 1205 (FIG. 12) causes the RISE clock 540 to operate much faster until the algebra module 108' can catch-up and request a needed edge that occurs in the future. Thus, a constant greater than the two used under normal conditions is needed to allow for the time to catch-up. For the synchronization mode, there is a latency period occurring after the synchronization signal and before the algebra module 108' places a transition edge. This latency period represents the time the synchronization module 304 needs to calculate when the transition edge can be placed to yield a "seamless" synchronization. The constant must be precisely and accurately determined to accommodate this latency period.

Under normal conditions or catch-up mode, the output of the times n module 600 is sent to the adder 628. The output is the multiplier data word 132a multiplied by the constant for the correct mode, either normal conditions or catch-up mode. The correct mode is determined by the input signal 604, received from the catch-up module 1205, which indicates whether the arbitrary waveform generator 100' is in catch-up mode or not. For synchronization mode, the output, which is the result of the multiplier data word 132a times the constant for the synchronization mode, is sent to the adder 624.

The output of the times n module 600 is added in adder 628 to the current value stored in register 616. The current value stored in register 616 represents the current phase 0 edge. Under normal conditions, the output of the adder 628 is the current phase 0 edge plus two times the desired period in terms of the reference clock signal 128. This represents the next phase 0 edge, which propagates through the mux 608 and is clocked into the register 616 at the next RISE clock signal 540. Mux 608 selects from adder 624 or adder 628 based on the switchover signal 596 received from the synchronization module 304. Under normal conditions, the output of adder 628 is selected. This loop (e.g., adding contents of register 616 to output of times n module 600 and storing on next RISE clock 540) is repeated to determine the next odd rising edge transition.

The phase 2 signal determination (and corresponding circuitry) is slightly different. Register 616 contains the current phase 0 edge. To calculate the next (e.g., second) rising edge, the output of register 616 (i.e., the first rising edge) is sent to adder 632' and added with the desired period, in terms of the reference clock 128 (i.e., the multiplier data word 132a). The output of adder 632' represents the value of the second (e.g., even) rising edge. The output of adder 632' is clocked into register 620' on the next inverted clock pulse RISEb 540'. The inverted clock RISEb 540' is used to meet stringent timing requirements in the phase 2 channel for generating edges 180 degrees out of phase with phase 0. The multiplier data word 132a can be changed at each (e.g., first and/or second and/or third, etc.) rising edge calculation. Thus the period can vary with each rising edge, producing an arbitrary waveform.

Referring back to FIG. 5, the output of the period integrator module 500 is sent to an adder 572. As stated above, the output of the period integrator module 500 represents the time, in terms of the reference clock 128, when the next odd transition edge is needed. Another input to the adder 572 is the current clock time 508. The current clock time 508 received from the clock domain transfer module 212 is subtracted from next odd transition edge time to determine the number and fraction of clock pulses 128 remaining before the placement of the next odd transition edge. As indicated in FIG. 6, the output of the period integrator module 500 for the next even transition edge is sent to an identical adder 572' (not shown). The circuitry shown in FIG. 5 for calculating the next odd transition edge is nearly identical for calculating the next even transition edge. One difference is that all of the registers 512', 516', 520', 524', 528', 532', 536' are clocked by the RISEb clock pulse 540'.

The user can shift the phase of the desired edge. This is done by a second data word 132b, which is part of the algebra data input signal 132. In one embodiment, the second data word 132b is a 21 bit signed word, where the first 8 bits represent integer reference clock periods and the other 13 bits represent fractional reference clock periods. The phase of the output signal can be shifted forward (e.g., if positive) or backward (e.g., if negative) by up to one hundred and twenty eight reference clock periods. If in synchronization mode, the phase shift is with respect to the last synchronization input 300.

If a phase shift input is requested using the second data word 132b, then the phase shift is stored in register 532 and added to adder 572. The output of adder 572 is the location of the next edge beyond the present muster clock signal 508, in units of periods of the reference clock 128. The output of adder 572 is clocked into register 520 at each RISE clock pulse 540. Since this value is in terms of the reference clock 128, it must be converted to units of laps and taps of the loop 104' by multiplier 576. Multiplier 576 multiplies the output of register 520 (i.e., the delta edge placement in terms of reference clock 128) by the output of register 512, which is the current average loop speed (i.e., taps per reference clock pulse 128). The result is the time of the next edge from the present muster clock signal 508 in terms of laps and taps of the loop 104'. The result (i.e., the output of the multiplier 576) is clocked into register 524 at a RISE clock pulse 540.

In one embodiment, the multiplier 576 is a seventeen bit by seventeen bit flash multiplier. Since the output of the adder 572 is, in one embodiment, 21 bits, a barrel shifter (not shown) is used in series between the adder 572 and the register 520. The barrel shifter shifts up to 4 leading (e.g., MSBs) zeros from the output o depending on relative loop speed, to reduce the binary representation to seventeen bits.

The output of the register 524, which represents the desired edge time by a number of laps and taps, is sent to adder 580*a* and added to the current state of the loop 104' to determine the absolute position of the next edge placement. In one embodiment, the sum can be further phase shifted by adding the value stored in register 536. The value stored in register 536 is received as a third data word 132*c*, part of the algebra data input signal 132. Because the phase shifting is in terms of taps instead of the reference clock signal 128, propagation delays in the system can be accurately cancelled using the third data word 132*c* input.

The output of adder 580 is sent to adder 584 for the addition of a constant 550. The constant 550 is determined by implementation choices. For example, it can be determined by chip layout, chosen to allow maximum setup/hold margins at the edge flip-flops 1215,1220. The constant 550 is based on known propagation delays (e.g., in tap units) to center the selected tap transitions in their windows. Constant 550 only affects selection of the lap and does not affect the selection of the tap. The output of the adder 584 is clocked into the register 528 on the RISE clock pulse 540. The value 560 stored in register 528 is the value 560 of the lap and tap that is used to select the next edge transition. The register value 560 is sent to the switching module 112, the fine delay module 310 and the output module 114 to select the correct edge transition for the next even rising edge (phase 0 signal) transition in the output signal 136.

The phase 2 signal circuitry similarly has a register 528' to store the value of the next odd rising edge transition. In one embodiment, the circuitry to create the corresponding even and odd falling edges (phase 1 signal and phase 3 signal), consists of an adder (not shown) which adds the contents of register 528 and 528'. The algebra module 108' divides the output of the adder by two to obtain a value corresponding to a time half way between two rising edges. Separate adders create the even and odd falling edges. In another embodiment, a fourth data word 132*d* (not shown) can be used with similar circuitry as depicted in FIG. 5 to place a falling edge anywhere between the even and odd rising edges based on the fourth data word 132*d*.

Figure 7:
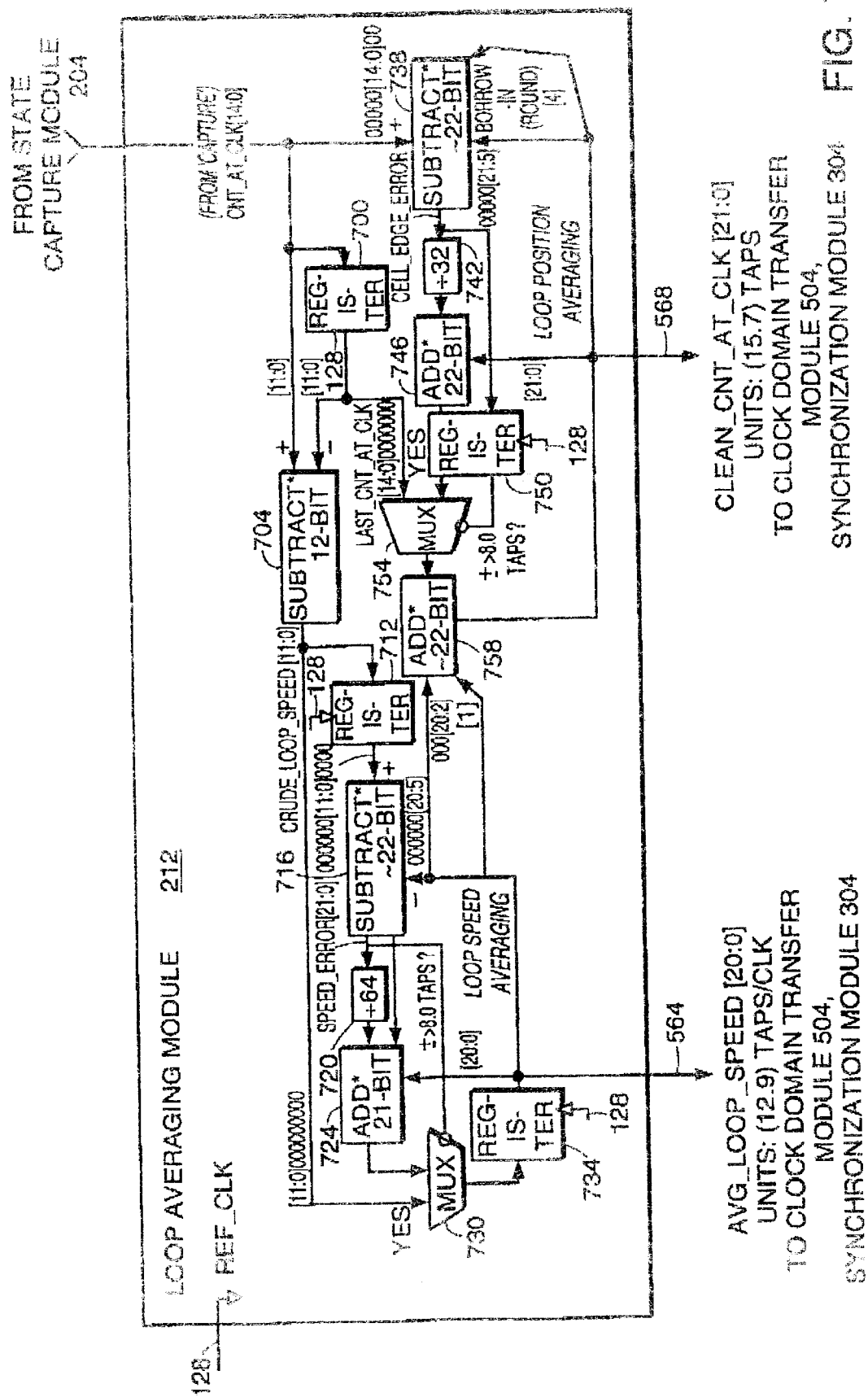
FIG. 7 is a detailed block diagram of one embodiment of the loop averaging module shown in FIG. 5.

In calculating the placement of the transition edges, the algebra module 108' uses the loop averaging module 212 and the clock domain transfer module 504. FIG. 7 depicts the loop averaging module 212 in more detail. The loop averaging module 212 receives the reference clock signal 128 to clock information into its registers 700, 712, 734, 750. The loop averaging module 212 also receives stored state information 220 from the state capture module 204'. As stated above, the stored state information 220 contains the state of the lap counter 200 and the last tap that the transition propagated through at the time of the capture on the reference clock 128 transition. The loop averaging module calculates the average speed of the loop in units of taps per reference clock 128. The loop averaging module 212 also calculates the averaged position of the loop at the latest reference clock pulse 128, or in other words, the instantaneous phase of the loop at the latest reference clock pulse 128.

The average loop speed portion of the loop averaging module 212 receives the current stored stated information 220 at the positive input of a subtraction element 704. Register 700 stores the value of the stored stated information 220 at the previous reference clock pulse 128. The subtraction element 704 receives the value stored in register 700 at the negative input. The output of the subtraction element 704 represents the difference and is the number of taps the transition has propagated through during one reference clock 128 period. This value is stored in register 712. In one embodiment, arithmetic elements 716, 720 and 724 are used to average the loop speed value stored in register 712 over sixty-four loop speed values (e.g., decay time constant=64) to obtain an average loop speed. Averaging over sixty-four clock pulses is a design choice to provide loop speed accuracy consistent with overall accuracy of the synthesizer. In other embodiments, the number of reference clock pulses 128 used for averaging is different.

The average speed is stored in register 734 and provided to the clock domain transfer module 504 and the synchronization module 304. In one embodiment, mux 730 is used to switch in the most recent loop speed into register 734 if the current loop speed varies from the average loop speed by more than eight taps per reference clock pulse 128. This allows a sudden change in loop speed to reset the average and minimizes large transients that can occur during startup. The variance of greater than eight taps is a design choice that can be changed to meet design goals.

In another embodiment not shown, the average loop speed 564 is further adjusted to compensate for variance in the power supply supplying power to the ring oscillator 104. This variance is due to noise at frequencies that are not filtered out by other circuits. An amplifying circuit (not shown) scales the voltage level of the variance to a usable level for the compensating circuit. The compensating circuit (not shown) measures the amplified variance in the power supply voltage (e.g., the noise) and digitizes this variance (e.g., sends the noise signal through an A/D converter). The compensating circuit sends the digital variance signal to the loop averaging module 212 to adjust the calculated average loop speed 564. The variance is a linear dependence (i.e., an increase in voltage increases the loop speed) and so the calculated average loop speed 564 is adjusted accordingly. The digital variance signal can be scaled as needed, using any of the techniques know in the art. Using more bits in the digital variance signal increases the precision of the compensation. In another embodiment, the compensating circuit sends the digital variance signal to the algebra module 108 to compensate for the power supply variance.

The averaged position (i.e., instantaneous phase) portion of the loop averaging module 212 tracks the calculated loop position in fractions of a tap and averages the position over time. A calculated average position is used for increased precision. The averaged loop position portion of the loop averaging module 212 receives, at the positive input of a subtraction element 738, the current stored stated information 220. The subtraction element 738 receives, at the negative AD input, the calculated averaged loop position, which is the output of the stored contents in register 750, the previous calculated averaged loop position added at adder 758 to the average loop speed stored in register 734. The difference, the output of the subtraction element 738, is the difference between the actual loop position and the calculated averaged loop position. In one embodiment, arithmetic elements 742 and 746 are used to average the difference over thirty-two values to obtain an average difference for the past thirty two reference clock pulses 128. A value other than thirty-two can be used. The calculated averaged loop position is stored in register 750.

In one embodiment, mux 754 is also used to switch in the previous loop position, stored in register 700, if the most current calculated averaged loop position difference from the actual loop position is greater than eight taps. This allows a sudden change in loop phase to reset the average and minimizes large transients that can occur during start-up. The variance of greater than eight taps is a design choice that can be changed to meet design goals. Depending on the state of mux 754, either the output of register 750 or the output of register 700 is added in adder 758 to the average loop speed 564 to create the calculated averaged loop position 568. The calculated averaged loop position 568 is sent to the clock domain transfer module 504 and the synchronization module 304. The average loop speed signal 564 and clean_cnt_at_clk signal 568 carry extra bits of precision than their respective time-constants would justify. This is done to avoid accumulating a DC bias from systematic rounding errors.

Figure 8:
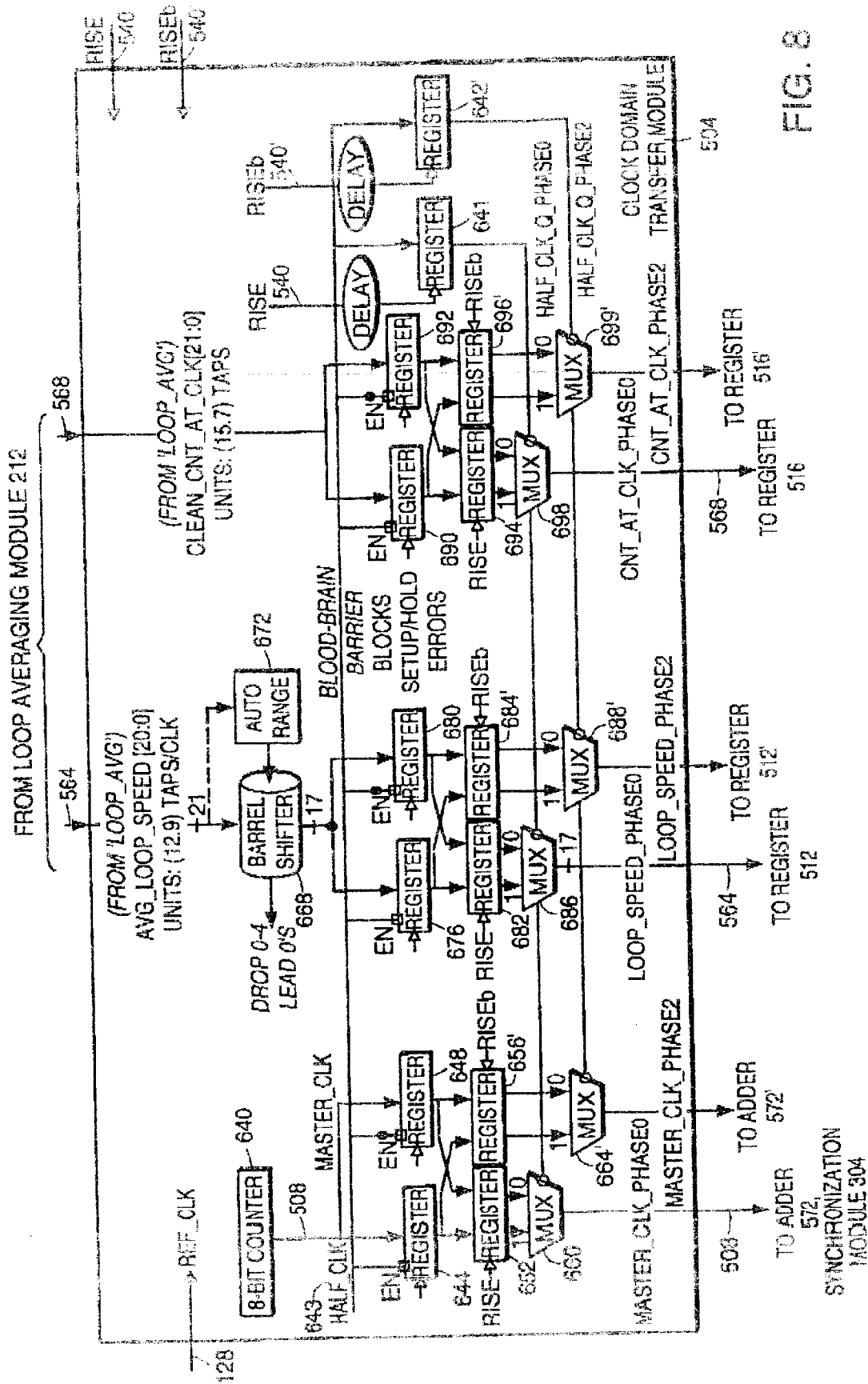
FIG. 8 is a detailed block diagram of one embodiment of the clock domain transfer module shown in FIG. 5.

The clock domain transfer module 504 is shown in more detail in FIG. 8. The clock domain transfer module 504 receives the average loop speed 564 and the calculated averaged loop position 568 from the loop averaging module 212, which is clocked in the reference clock 128 domain. The clock domain transfer module 504 transfers the signals in the reference clock 128 domain to signals in the RISE clock 540 domain. The clock domain transfer module 504 provides stable values to the registers 512, 516 (FIG. 5) of the algebra module 108', which are clocked in the RISE clock 540 domain. The clock domain transfer module 504 also provides the current clock time 508, which starts as a counter 640 in the reference clock 128 domain and is sent to adder 572, which operates in the RISE clock 540 domain. In the embodiment shown, the counter 640 is an eight bit counter and rolls over to zero upon reaching its maximum value. The circuit shown simultaneously corrects these signals to the RISEb (e.g., the phase 2 circuitry).

From the reference clock signal 128, a half_clk signal 643 is created. Dividing the frequency of the reference clock signal 128 by two creates the half_clk signal 643. The first layer of registers 644, 648, 676, 680, 690, 692 are clocked with the reference clock signal 128. The first layer of registers 644, 648, 676, 680, 690, 692 are used to ensure that the signals 508, 564, 568 are captured correctly in the reference clock 128 domain. The circuits (i.e., propagation path) for each signal 508, 564, 568 include a pair of first layer registers 644 and 648, 676 and 680, 690 and 692, respectively. One register of each pair 644, 676, 690 is enabled when the half_clk signal 643 is in a positive state. The other register of the pair 648, 680, 692 is enabled when the half_clk signal 643 is in a negative state. For the calculation of the phase 0 transition edge, registers 652, 682, 694 of the second layer of registers are used. Using the pairs of first layer registers 644 and 648, 676 and 680, 690 and 692, ensures that at least one register of the pair is stable when clocking into the registers 652, 682, 694 in the RISE clock 540 domain. Stability is assured even if a the reference clock signal 128 transitions during a clocking of the RISE clock 540 domain registers 652, 682, 694. Each mux 660, 686, 698 determines which of the pair of first layer registers 644 and 648, 676, and 680, 690 and 692, is used as outputs of the clock domain transfer module 504. The one used is stable. The mux channel selection is made by the state of the half_clk 643 stored in register 641. This register stores the state of the half_clk signal 643 at some delayed time after the RISE clock 540 clocks data into the RISE clock 540 domain registers 652, 682, 694. Whenever half-clk is transitioning when it is captured, the outputs of registers 641 and 642' are unpredictable. However, all first tier registers are stable at this time so that the one selected doesn't matter, as long as the same one is selected for master_clk signal 508 and clean_cnt_at_clk signal 568. The delays shown are necessary to guarantee this property.

For the calculation of the phase 2 (e.g., even transition edge) similar circuitry is used (i.e., registers 656', 684', 696', 642' and muxes 664', 688', 699'). One difference is that all of the registers 656', 684', 696', 642' are clocked using the RISEb signal 540'. In the embodiment shown, the average loop speed signal 564 received from the loop averaging module 212 is twenty one bits. A barrel shifter 668 and auto range element 672 are used to shift out up to four leading bits and convert the signal to seventeen bits.

Figures 1, 9A:
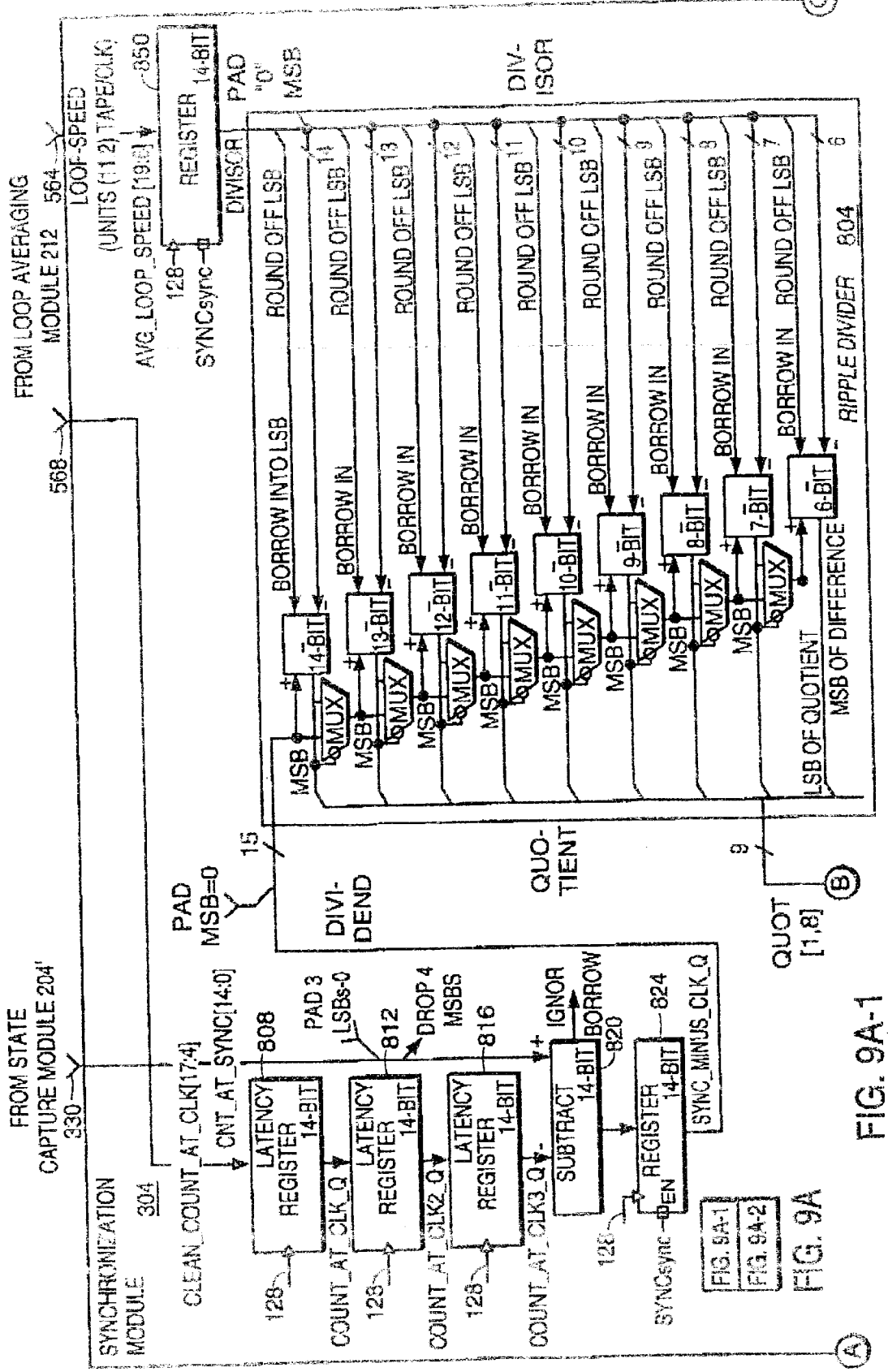
FIG. 9A is a detailed block diagram of one embodiment of the synchronization module shown in FIG. 5.
Figures 2, 9A:
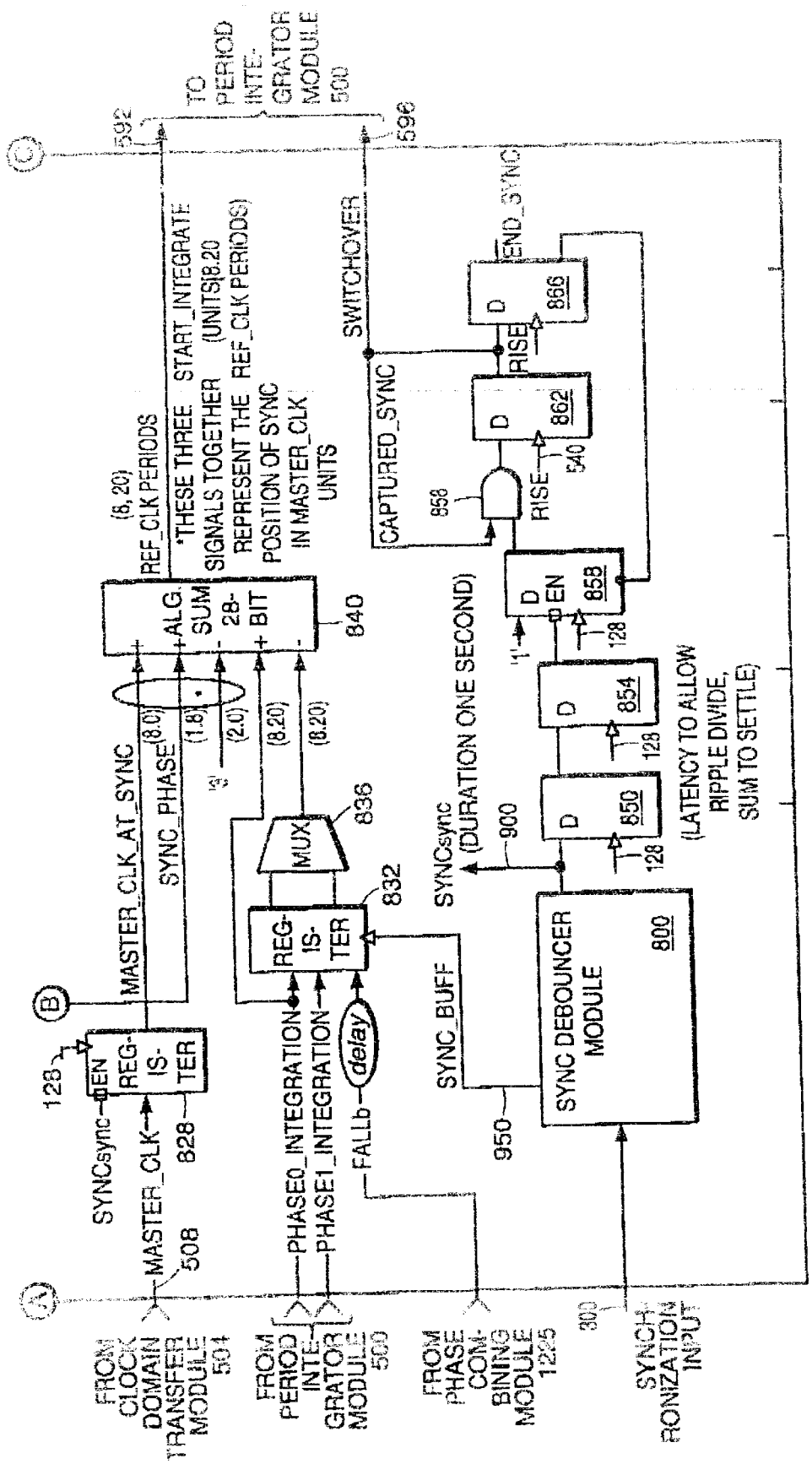

If a synchronization signal is used to determine the phase of the output signal 136 (i.e., synchronization mode), the synchronization module 304 is involved in calculating the time of the next edge transition. FIG. 9A depicts the synchronization module 304 in more detail. The synchronization module 304 receives a synchronization input 300, the average loop speed 564 and calculated average position 568 from the loop averaging module 212. The synchronization module 304 receives the stored state information 330 from the state capture module 204'. The stored state information 330 contains the state of the lap counter 200 and the last transitioned tap at the time of the capture on the synchronization input 300 transition. The synchronization module 304 outputs a start_integrate signal 592, which represents the time when a seamless edge transition can be placed. The edge transition is seamless because the synchronization module 304 determines an exact half-cycle when the newly phased output can replace the old with a minimum "glitch". The synchronization module 304 selects this transition edge as the point to switchover to output signal 136 to one in phase with the synchronization input 300. The synchronization module 304 generates a switchover signal 596 to indicate to the period integrator module 500 that the needed edge transition has been calculated by the synchronization module 304 and should be substituted into the period integrator Module 500.

To calculate the seamless edge transition placement, the synchronization module 304 subtracts the calculated average position 568 at the time of the preceding reference clock 128 pulse from the stored state information 330 using the subtraction element 820. The output of the subtraction element 820 represents the phase shift between the reference clock 128 and the synchronization input signal 300, in units of taps. Three registers 808, 812, 816 are used to retain the calculated average position 568 of the loop 104' at the time of the preceding reference clock 128 pulse for two additional reference clock 128 pulses, the time it takes the sync debouncer module 800 to debounce the synchronization signal 300.

Figure 9B:
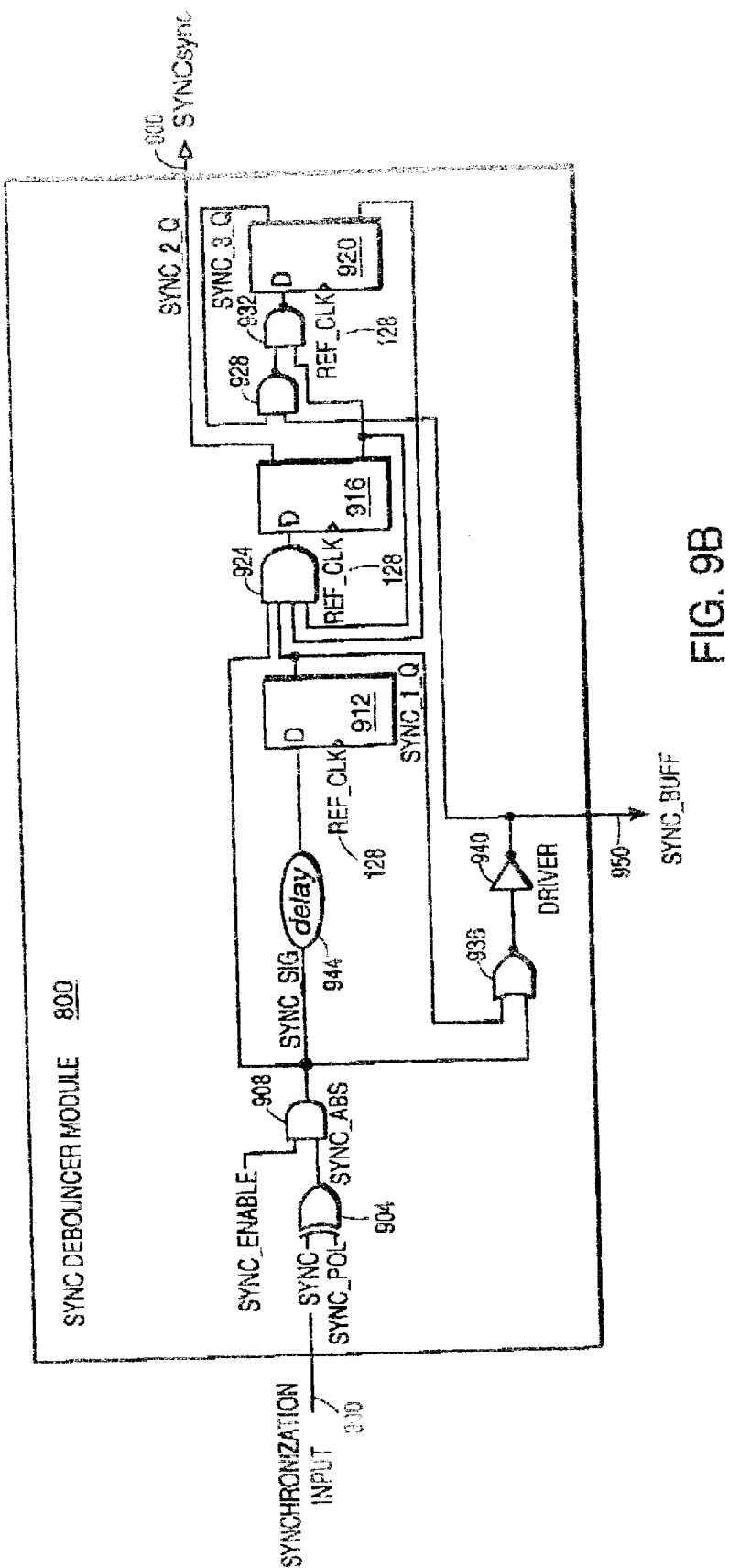
FIG. 9B is a detailed block diagram of one embodiment of the sync debouncer module shown in FIG. 9A.

The sync debouncer module 800 is shown in more detail in FIG. 9B. The XOR element 904 is an optional element that allows the user to set the polarity of the synchronization input signal 300. The sync_pol input is set to the active transition of the synchronization input signal 300. In the embodiment shown, the debouncing circuitry is set up for an active rising synchronization input signal 300. The XOR element 904 ensures that the output of the XOR element 904 is an active rising signal, regardless of the polarity of the synchronization input signal 300 used. The AND element 908 allows the user to enable and disable synchronization mode. If sync_enable is disabled (e.g., low state), no synchronization pulse is propagated through the sync debouncer module 800.

The sync debouncer module 800 outputs a sync_buff signal 950. The synch_buff signal 950 is used to clock register 832 (FIG. 9A), which captures the output of the period integrator module 500, representing the next two desired transition edges, phase 0 and phase 2, at the time of the synchronization pulse 300. Sync-buff provides the snyc input to the state capture module 204'. The logic element 936 makes the sync_buff signal last only from the time the synchronization input 300 transitions until the first D input to flip flop 912 changes state. Delay 944 is added to ensure that the sync input to module 204' precedes the edge at the D flip flop 912. The time frame for the sync_buff signal 950 is narrow to allow the SYNC signals arbitrarily near a ref-clk 128 edge without error. Once register 832 has stored the information and the first D flip flop has changed state, the next D flip flop 916 changes state at the subsequent reference clock 128 pulse. The AND element 924 only switches to a high state if the synchronization pulse (i.e., the output of AND element 908) is high, the first D flip flop 912 has changed to a high state and the second and third D flip flops 916, 920 are in a low state. If the output of the AND element 924 is high at the subsequent reference clock 128 pulse, the output of the second D flip flop 915 changes to a high state. This creates a stable (i.e., debounced) synchronization signal 900 ("SYNCsync"). Any SYNC signal lasting less than two reference clock 128 pulses will not be seen. The SYNCsync signal 900 lasts for one period of the reference clock 128. NAND elements 928, 932 and the third D flip flop 920 ensure that at the next clock pulse subsequent to the SYNCsync signal 900, the second D flip flop 916 changes state again. When the second D flip flop 916 changes state again, the SYNCsync signal 900 ends.

Referring back to FIG. 9A, the SYNCsync signal 900 is used to enable register 824. Register 824 stores the output of the subtraction element 820 at the next reference clock 128 pulse subsequent to the SYNCsync signal 900. The SYNCsync signal 900 is also used to enable register 850, which stores the average loop speed 564 at the next reference clock 128 pulse subsequent to the SYNCsync signal 900. The ripple divider 804 divides the stored phase shift information in register 824, which is in units of taps, by the average loop speed stored in register 850, which is in units of taps per reference clock 128. The result represents the difference between the reference clock 128 and the synchronization input 300, now in units of the reference clock 128.

The result is sent to a positive input on the summer 840. The current clock time 508, which is stored in register 828 is also sent to a positive input of the summer 840. A constant three is sent to a negative input of the summer 840. This constant represents the latency of three reference clock 128 pulses for the sync debouncer module 800 and is thus subtracted. The current (i.e., at time of switchover) phase 0 edge placement is sent to a positive input of the summer 840. Either the phase 0 edge placement or the phase 2 edge placement captured in register 832 is sent to a negative input of the summer 840. Mux 836 selects the signal to be used, based on the state of the FALLb signal at some time period, equal to the delay 854. This is asynchronous transfer of data between clock domains, prior to the sync_buff signal 950. The selected signal represents the calculated transition edge at the time of the synchronization pulse 300. This is subtracted from the current (i.e., at time of switchover) phase 0 edge transition to compensate for the latency of the synchronization module 304. The output 592 of the summer 840 is sent to register 612 (FIG. 6) of the period integrator module 500 (FIG. 6). The output 592 represents the first seamless edge transition for an output signal 136 in phase with the synchronization input 300, in terms of the reference clock 128.

The D flip flops 850, 854, 858 are used as a delay to ensure that the ripple divider 804 has settled before switchover occurs. The D flip flops 862, 866 are used to align the switchover signal with the RISE clock 540, which is the clock that the registers in the period integrator module 500 use. D flip flop 866 and AND element 858 ensure that the switchover signal lasts for only one period of the RISE clock 540. The switchover signal 596 is used by the mux 608 (FIG. 6). When active, the mux 608 selects the output of adder 624, which includes the calculated edge transition from the synchronization module 304. At the next RISE clock 540 pulse, the calculated edge transition is clocked into register 616 (FIG. 6) and the switchover signal becomes NOT active. The mux 608 then selects from the output of the adder 628, which as described above continues to add desired period lengths to the previous transition edge.

As described above referring to FIG. 5, the first seamless edge transition for an output signal 136 in phase with the synchronization input 300, in terms of the reference clock 128, is output from the period integrator module 500. It propagates through adder 572 and multiplier 576 where it is converted from reference clock 128 periods to number of taps. The edge transition calculation then proceeds through adder 580 and adder 584, where it is stored in register 528 on a RISE clock 540 pulse. The output 560 of register 528, which represents the edge transition placement in terms of taps and laps, is sent to the switching module 112. Switching module 112 uses this information to select the desired tap of loop 104' to create the next edge transition.

Figure 10A:
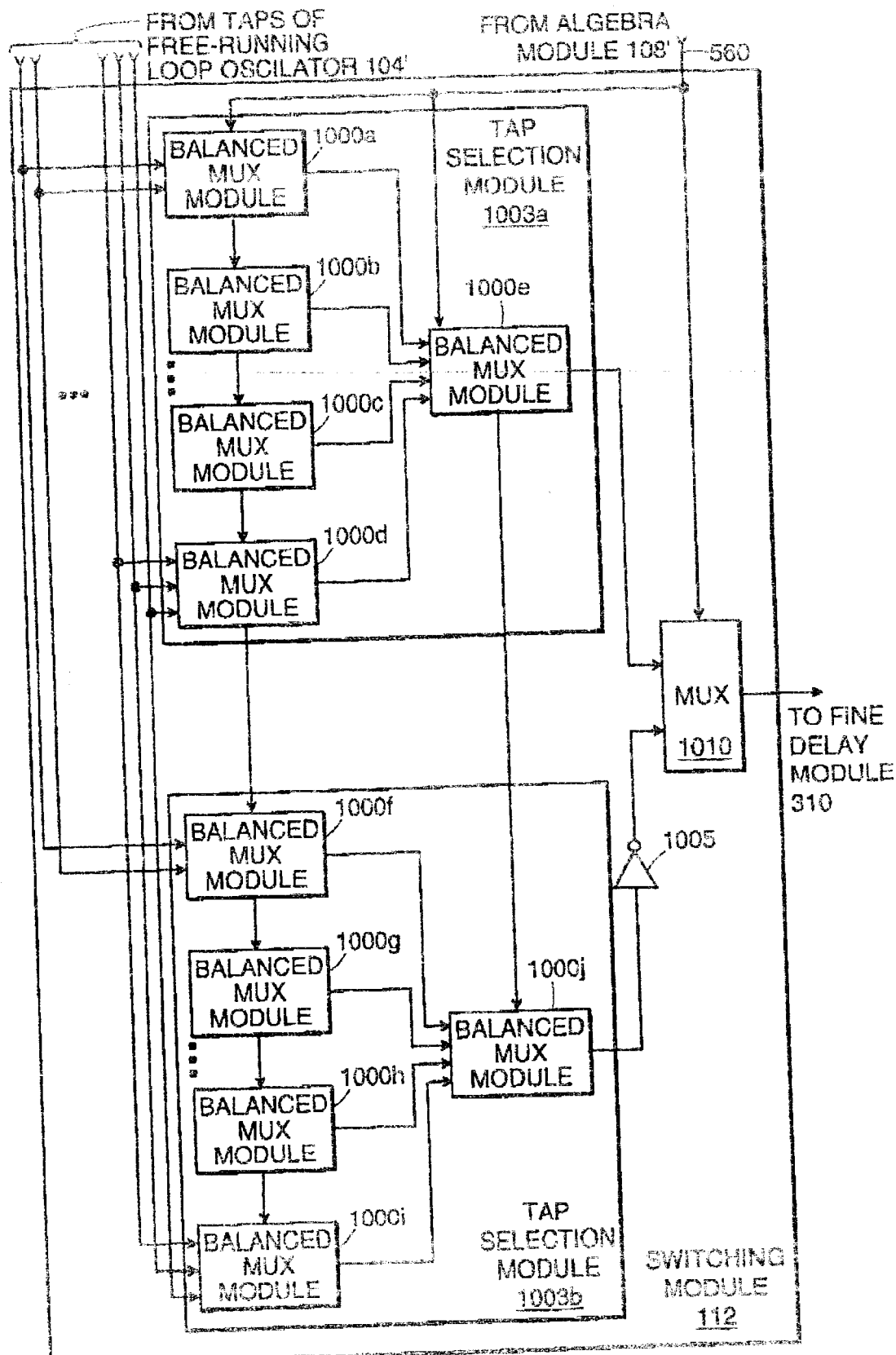
FIG. 10A is a detailed block diagram of one embodiment of the switching module of the invention.
Figure 10B:
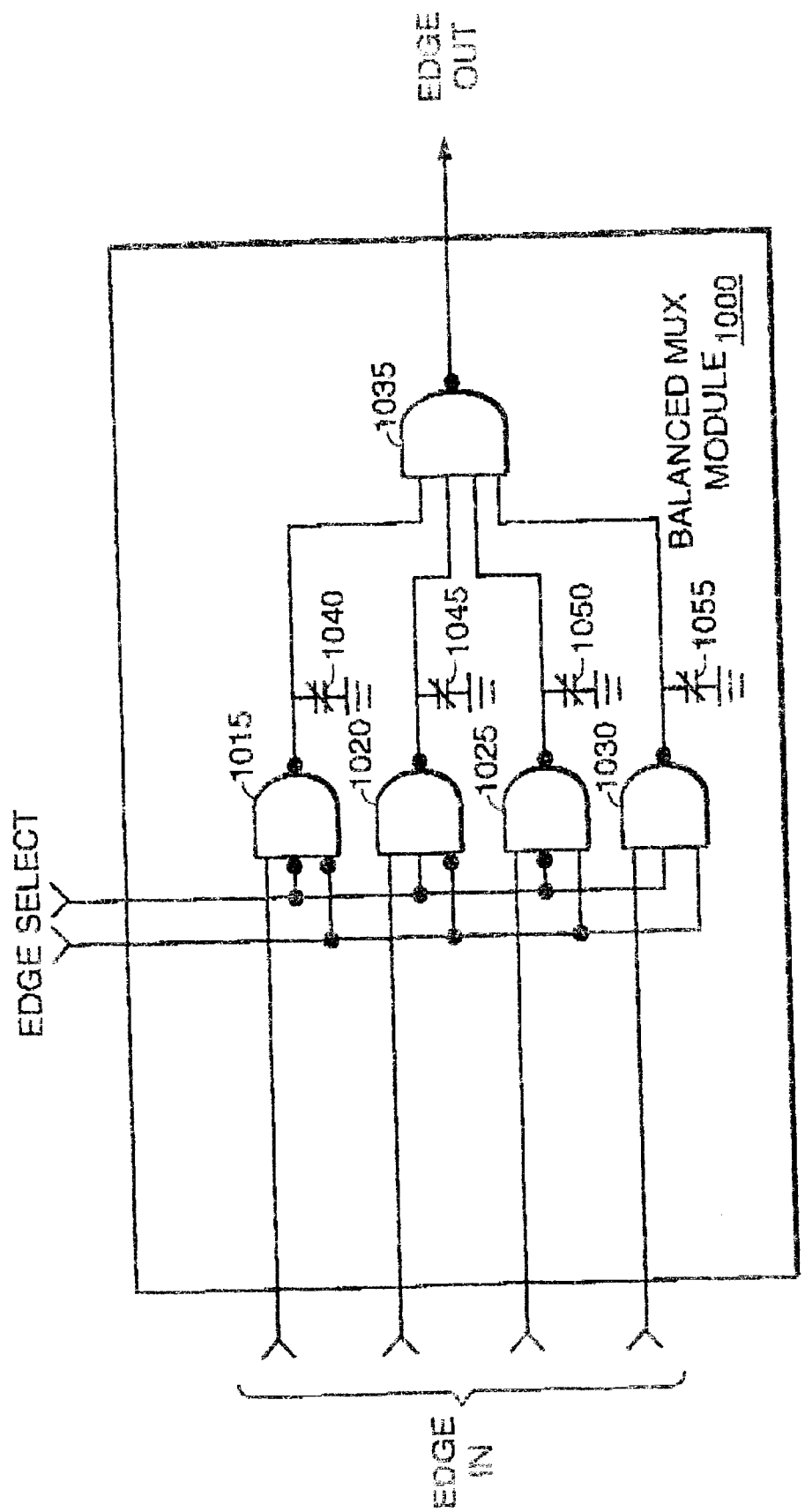
FIG. 10B is a detailed block diagram of one embodiment of the balanced mux module shown in FIG. 10A.

FIGS. 10A and 10B depict the switching module 112 in more detail. FIG. 10A depicts the configuration of muxes 1000, 1003, 1010 used for selecting an edge for the phase 0 signal. In one embodiment, a sixteen-to-one tap selection module 1003 is used to select a transition edge from one of sixteen taps of the loop 104'. The tap selection module 1003 is made up of five balanced mux modules 1000.

FIG. 10B depicts a balanced mux module 1000 in more detail. The balanced mux module 1000 is a four-to-one mux. The balanced mux module 1000 includes NAND elements 1015, 1020, 1025, 1030 1035 and capacitive delay elements 1040, 1045, 1050, 1055. In one embodiment, the capacitive delay elements 1040, 1045, 1050, 1055 are implemented using IC library cells designed for the purpose of creating capacitors in an IC, as is know in the art. The capacitance of the capacitive delay elements 1040, 1045, 1050, 1055 causes a delay in the signal transition as the signal propagates along the corresponding path. The balanced mux module 1000 receives an edge select input, which in one embodiment is a two bit signal that defines which of the four inputs are selected. NAND elements 1015, 1020, 1025, 1030, 1035 are used to select and propagate the requested edge to the output.

The NAND 1015, 1020, 1025, 1030, 1035 elements are the same for each of the balanced mux modules 1000*a*, 1000*b*, 1000*c*, 1000*d*, 1000*e*, 1000*f*, 1000*g*, 1000*h*, 1000*i*, 1000*j*, depicted in FIG. 10A. However, the capacitive delay elements 1040, 1045, 1050, 1055 are different for each of the balanced mux modules 1000a, 1000b, 1000c, 1000d, 1000e, 1000f, 1000g, 1000h, 1000i, 1000j, depicted in FIG. 10A. This is necessary because the value of the capacitive delay elements 1040, 1045, 1050, 1055 are based on two factors, the values of which are different for each of the balanced mux modules 1000a, 1000b, 1000c, 1000d, 1000e, 1000f, 1000g, 1000h, 1000i, 1000j.

The first factor is whether the transition being propagated is a positive going (i.e., from a low state to a high state) or negative going (i.e., from a high state to a low state) transition. The two types of transitions propagate through the NAND elements 1015, 1020, 1025, 1030, 1035, and other elements in their path, at different rates. The value of the capacitive delay elements 1040, 1045, 1050, 1055 compensates for these two different rates. The second factor is that the paths the edges propagate through from the taps to the switching module 112 and through the switching module 112 have different lengths. The value of the capacitive delay elements 1040, 1045, 1050, 1055 compensates for these different path lengths. The value of the capacitive delay elements 1040, 1045, 1050, 1055 ensures that the time a transition edge propagates from a tap to the output of the switching module 112 is equivalent, regardless of the polarity of the signal or the path length the signal has to propagate. The value of the capacitive delay elements 1040, 1045, 1050, 1055 varies, dependent on the layout of the implementing hardware. These capacitors also correct for any irregularities in the loop of delay elements 104.

In another embodiment, each first capacitive delay element 1040, 1045, 1050, 1055 of the balanced mux module 1000 has a second corresponding capacitive delay element 1040a, 1045a, 1050a, 1055a (not shown). Each of the second corresponding capacitive delay elements 1040a, 1045a, 1050a, 1055a is in parallel with its associated first capacitive delay element (i.e., 1040 in parallel with 1040a). The set of first capacitive elements 1040, 1045, 1050, 1055 react similarly to variations in temperature, process and supply voltage. The set of second corresponding capacitive delay elements 1040a, 1045a, 1050a, 1055a do not react similarly to variations in temperature, process and supply voltage. This ensures that variations in propagation delay that are not linear with respect to variations in temperature, process and supply voltage can be compensated for with the set of second corresponding capacitive delay elements 1040a, 1045a, 1050a, 1055a. The second set corresponding capacitive delay elements 1040a, 1045a, 1050a, 1055a are implemented by a different IC process than was used to implement the set of first capacitive delay elements 1040, 1045, 1050, 1055. Any of the several methods known in the art can be utilized.

Referring back to FIG. 10A, a first tap selection module 1003a is used and calibrated (i.e., selection of values of capacitive delay elements) to receive a rising (i.e., positive going) transition so from the taps of the loop 104'. A second tap selection module 1003b is used and calibrated (i.e., selection of values of capacitive delay elements 1040, 1045, 1050, 1055) to receive a falling (i.e., negative going) transition from the taps of the loop 104'. If the tap selected is a falling edge, and thus selected by the second tap selection module 1003b, it is inverted with inverter 1005. Mux 1010 selects which tap selection module 1003a, 10003b is used, based on an input received from the algebra module 108'. The phase 1, phase 2 and phase 3 signals each have a similar configuration of muxes to select corresponding edges. The rising edge out of MUX 1010 is always the active edge.

Figure 11:
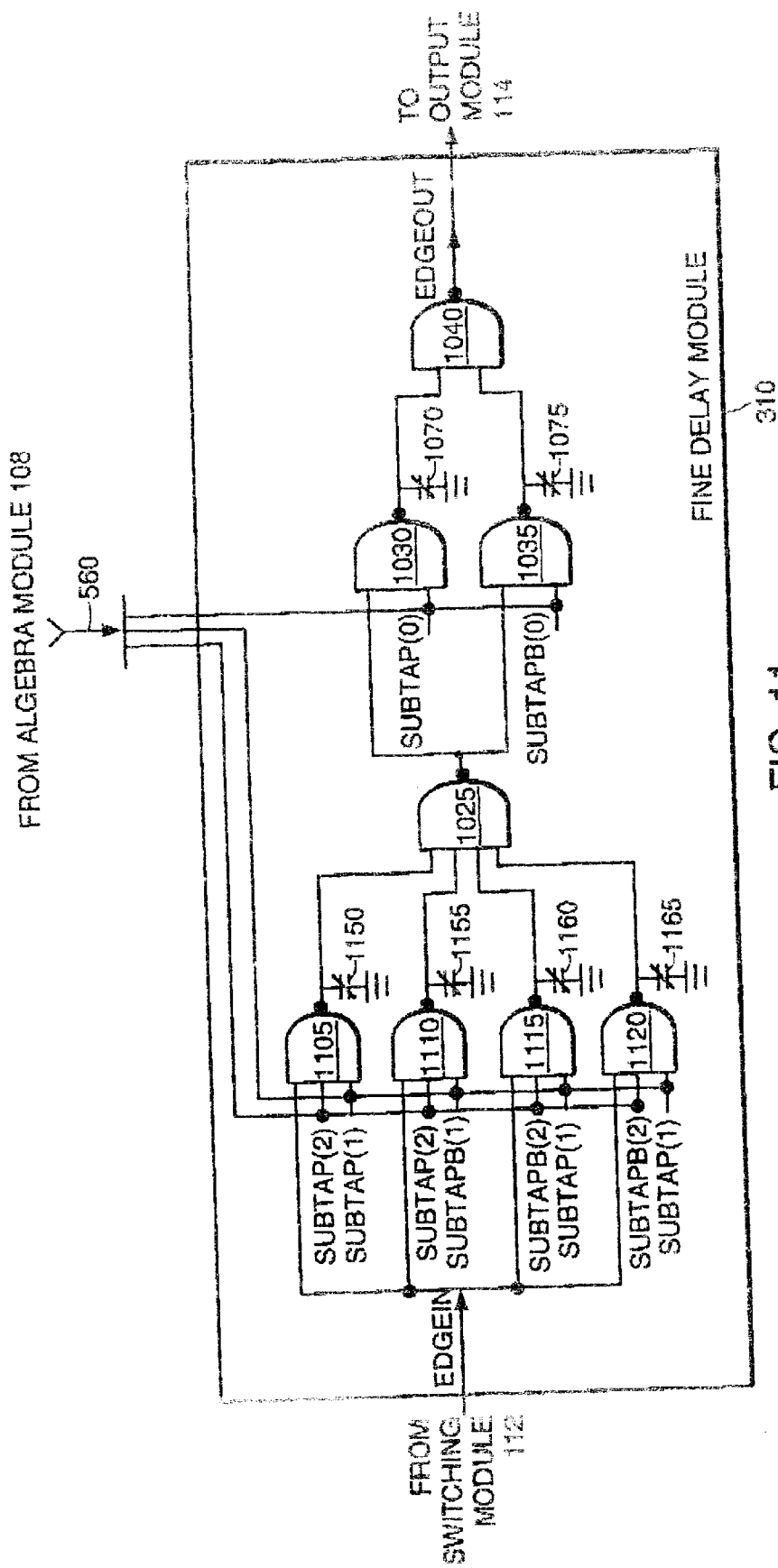
FIG. 11 is a detailed block diagram of one embodiment of the fine delay module of the invention.

FIG. 11 depicts the fine delay module 310 in more detail. The purpose of the fine delay module 310 is to delay the transition edge by a differential amount of time that is smaller than the time between the taps of the loop 104' (e.g., smaller than the 300 picoseconds depicted in FIG. 1B). The fine delay module 310 increases the precision of the placement of the edge transition in the output signal 136. The fine delay module 310 includes NAND elements 1105, 1110, 1115, 1120, 1125, 1130, 1135, 1140 and capacitive delay elements 1150, 1155, 1160, 1165, 1170, 1175. The fine delay module 310 receives an edge select input, which in one embodiment is a three bit signal that defines which of the eight possible paths are used. NAND elements 1105, 1110, 1115, 1120, 1125, 1130, 1135, 1140 are used to select and propagate the requested edge to the output, routing the edge through one of eight possible paths. The arbitrary waveform generator 100' includes a fine delay module for each of the channels the algebra module 108' has calculated (e.g., phase 0, phase 1, phase 2, and phase 3). The edge of interest is always positive going entering and leaving the fine delay module 105.

As described above, the capacitive delay elements 1150, 1155, 1160, 1165, 1170, 1175 can be different for each fine delay module 310. However in the preferred embodiment the internal layout of the fine delay modules are all identical, resulting in identical capacitance values. Also as described above, each fine delay module can include a set of corresponding second capacitive delay elements 1150a, 1155a, 1160a, 1165a, 1170a, 1175a. In one embodiment, even the fastest path through the fine delay module 108 is much greater than the delay time between each tap. However, the difference of the delay times between any two of the eight possible paths is less than the delay time between each tap. The large fixed component of delay added by fine delay module is compensated for by part of the constant 550 (FIG. 5) used by the algebra module 108' and (optionally) by part of the phase compensation input 132c in the algebra module 108'. The output of the fine delay module 310 is sent to the output module 114.

Figure 12:
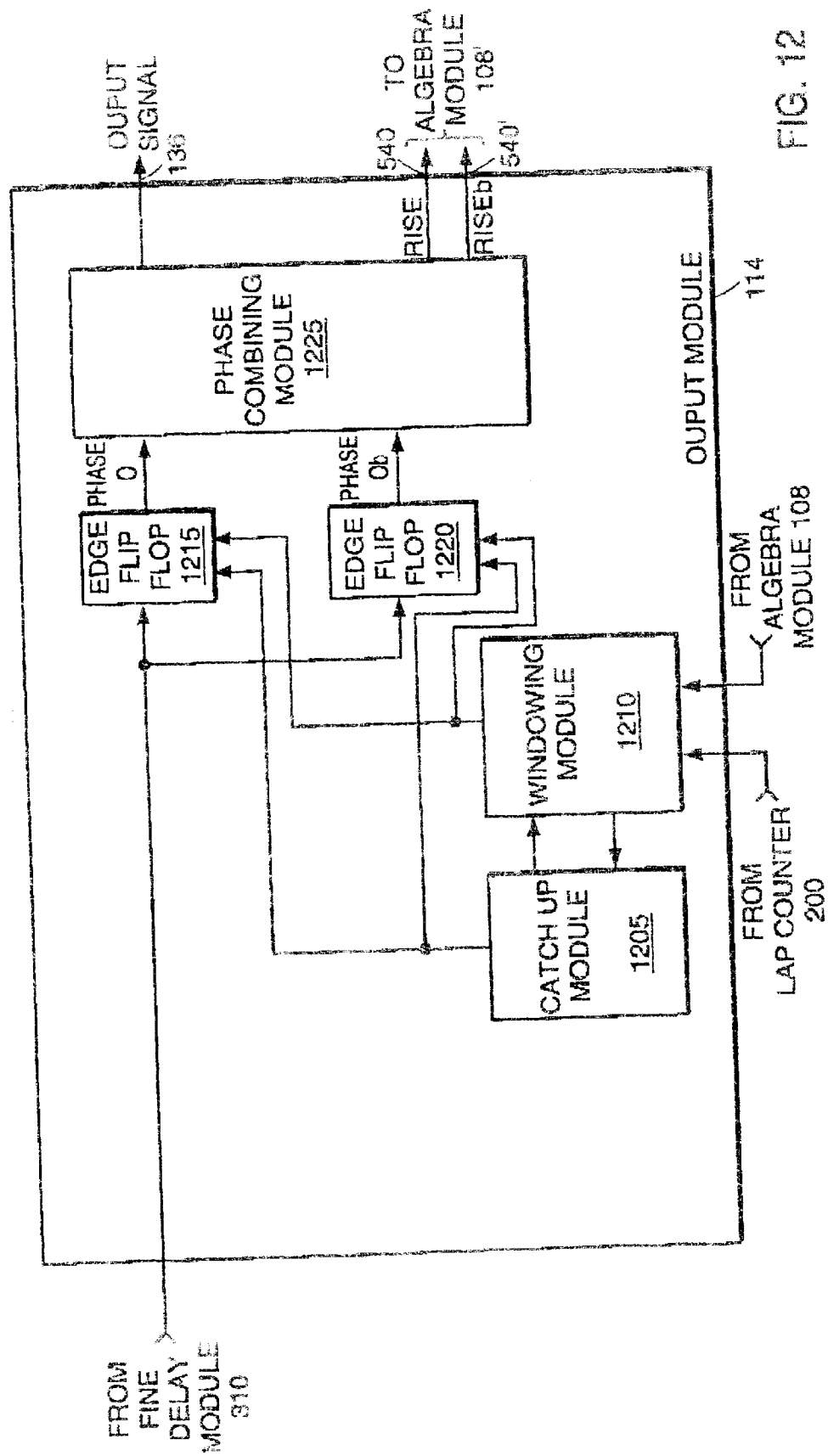
FIG. 12 is a detailed block diagram of one embodiment of the output module of the invention.

The output module 114 is depicted in more detail in FIG. 12. The output module includes a pair of edge flip flops 1215, 1220 and a windowing module 1210. These three components 1215, 1220, 1210 are included for each channel (e.g., phase 0, phase 1, phase 2, and phase 3). The output module 114 also includes a phase, or channel, combining module 1225. The outputs of the pair of edge flip flops 1215, 1220 for each channel (e.g., phase 0, phase 1, phase 2, and phase 3) are sent to the phase or channel, combining module 1225. The phase, or channel, combining module 1225 combines all of the channel signals (e.g., phase 0, phase 1, phase 2, phase 3) into a single output 136. If multiple outputs are required, various combinations of channels are combined by respective channel-combining modules 1225 for each output. The output module 114 also includes a catch-up module. In one embodiment, the catch-up module only involves the rising edge channels (e.g., phase 0, phase 2).

Figure 13A:
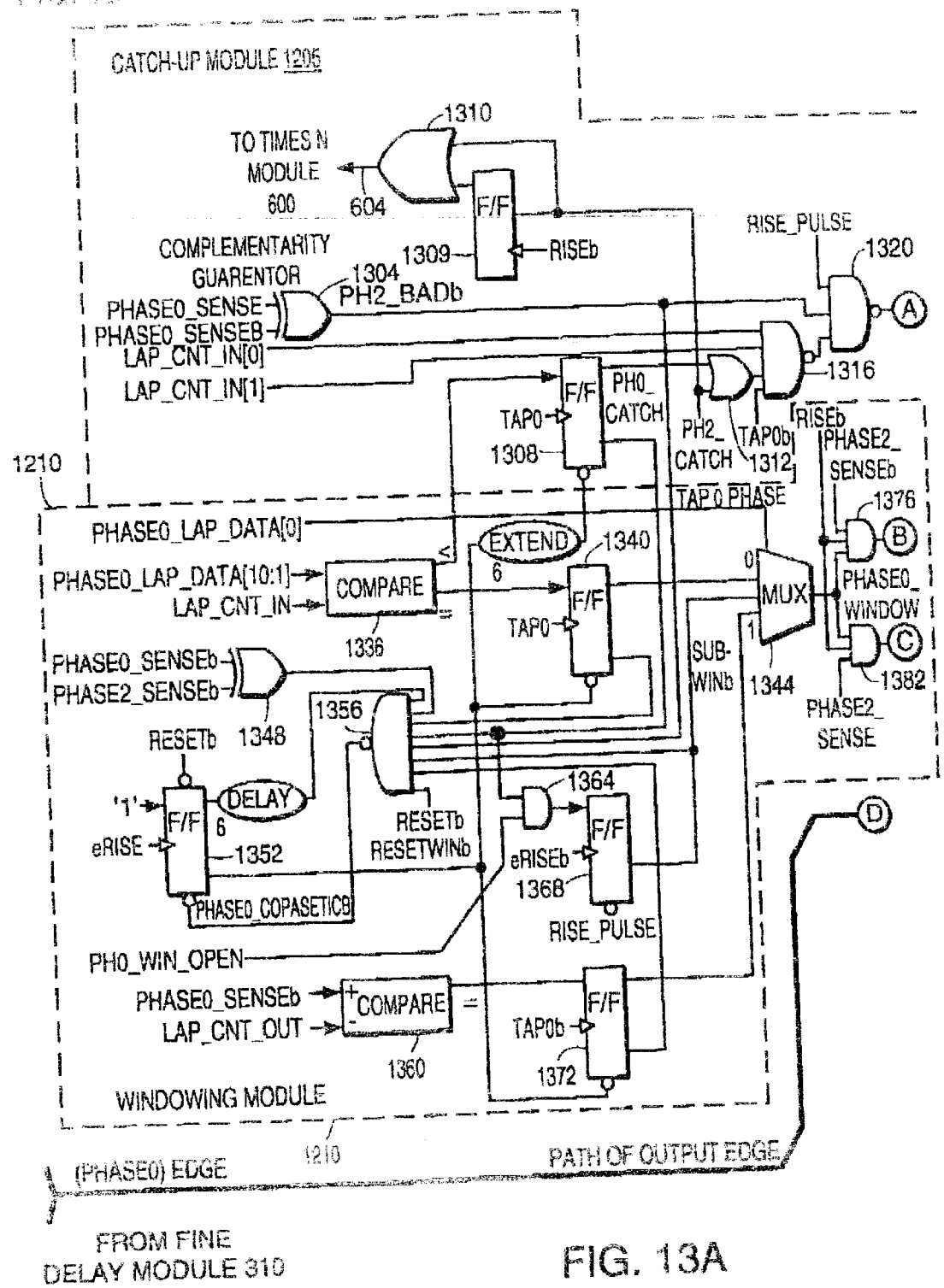
FIG. 13 is a detailed block diagram of one embodiment of the catch-up module, the windowing module and the edge flip flops shown in FIG. 12.
Figure 13B:
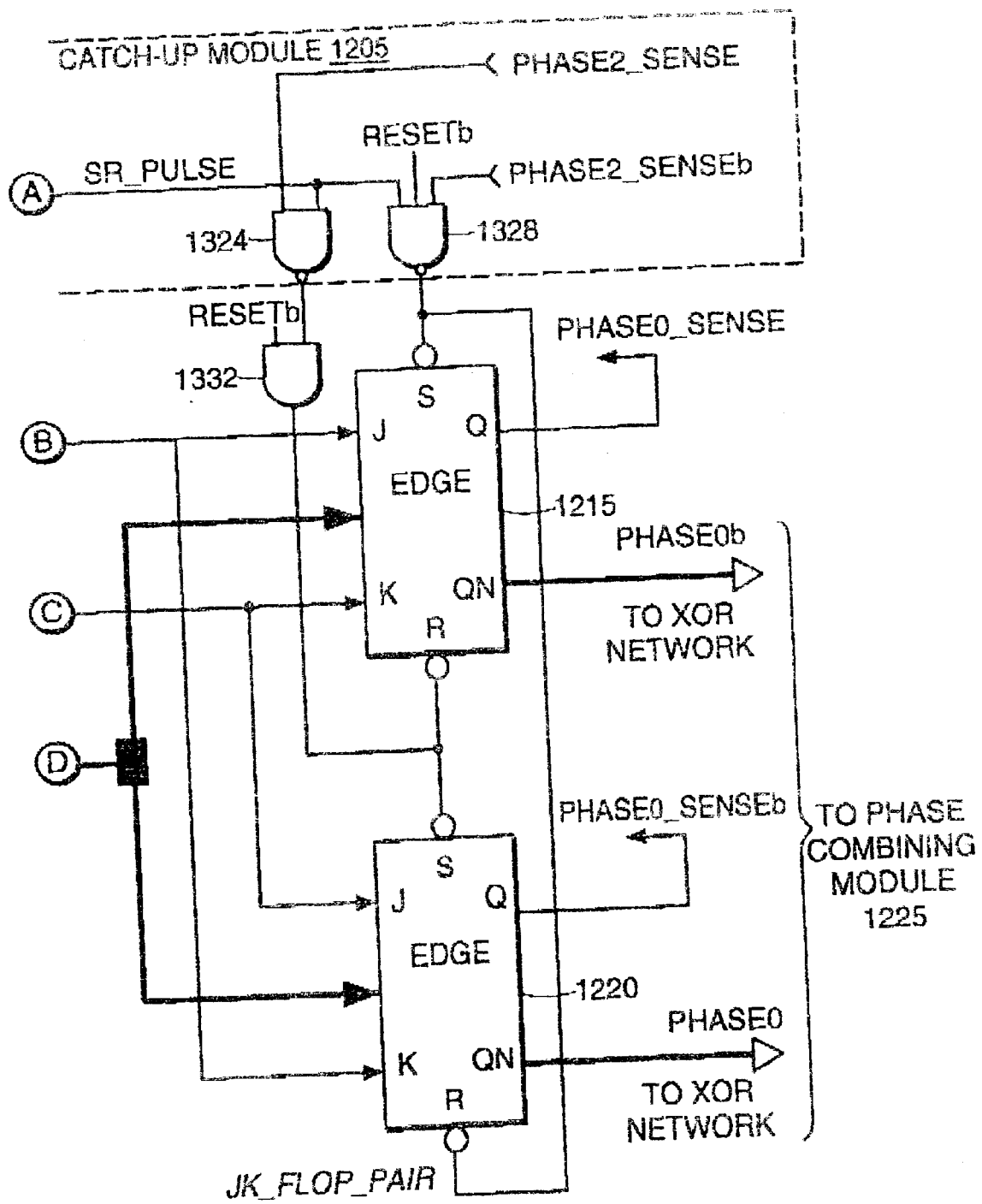

The catch-up module 1205, the windowing module 1210 and the pair of edge flip flops 1215, 1220 are depicted in more detail in FIG. 13. The phase 0 edge received from the fine delay module 310 is used as the clock for both edge JK flip flops 1215, 1220. The JK inputs of the pair of edge flip flops 1215, 1220 are received from the windowing module 1210. In one embodiment, the windowing module 1210 has two comparators 1336, 1360. A first comparator 1336 compares the lap calculated by the algebra module 108' with the in-phase lap counter 200a. A second comparator 1360 compares the lap calculated by the algebra module 108' with the out-of-phase lap counter 200b. When the lap calculated by the algebra module 108' is equal to the lap counter 200, the window is open. The pair of edge flip flops are set to clock the edge transition input from the fine delay module 310 by AND element 1376 or 1382. Either window-opening flip flop 1340 or flip flop 1372 is used, selected by mux 1344 based on a single bit calculated in the algebra. A XOR element 1348, a flip flop 1352, and a NAND element 1356 are used to reset and close the window after the desired edge transition has successfully clocked the pair of edge flip flops 1215, 1220. A flip flop 1368 and an AND element 1364 are used to create a substitute window when so instructed by algebra signal ph0_win_open. The substitute window is used to allow the waveform synthesizer to operate at high frequencies, for instance at frequencies higher than the free-loop-itself. In that situation, the desired loop is already in progress and it is too late to use the mechanism involving comparators 1350, 1336. Instead, the substitute window "opens" immediately, save for delays, to allow relevant data to be valid.

The first comparator 1336 also determines whether the lap calculated by the algebra module 108' is less than the current value of the lap counter 200a plus a margin for latency. If it is less, then the algebra module 108' has transmitted an erroneous calculation and the first comparator sends a signal to the catch-up module 1205. The catch-up module 1205 is activated when the algebra module 108 requests a lap that has occurred in the past (i.e., the lap requested is less than the present lap). The output of the comparator 1336, indicating that a past lap is requested, is sent to the flip flop 1308 of the catch-up module 1205. At the next period of the loop 104', that error signal is clocked into flip flop 1308. The output of the flip flop 1308, labeled ph0_catch is sent to an OR element 1312. The phase 2 signal has a similar catch-up module 1205' (not shown). One difference is that the flip flop element 1309 and the OR element 1310 are not included with the phase 2 catch-up module 1205'. Phase 1 and phase 3 signals do not have catch-up modules 1205. The output of flip flop 1308' (not shown) of the phase 2 catch-up module 1205' is also input to the OR element 1312 and input to the flip flop 1309. On the RISEb clock 540' pulse subsequent to the change of the output of flip flop 1308', the flip flop 1309 outputs an active catch-up signal to the OR element 1310. The OR element 1310 outputs an active catch-up signal 604 to the times n module 600 of the period integrator module 500. As described above, the times n module 600 uses this signal 604 to determine whether the arbitrary waveform generator is in catch-up mode and applies the correct multiplier. When in catch-up mode, NAND elements 1316, 1320, 1324, 1328 and AND element 1332 are used to create RISE clock 540 pulses at one-fourth the speed of the free-loop 104', using the set and reset inputs of the pair of edge flip flops 1215, 1220. As described above, catch-up mode creates a substitute fast clock for algebra module 108' and increases the programmed period until the lap requested is once again in the future. At that time, the catch-up module 1205 terminates catch-up mode (e.g., changes the catch-up signal 604 to the NOT active state). When the circuit recovers, it recovers in the correct phase.

Figure 14:
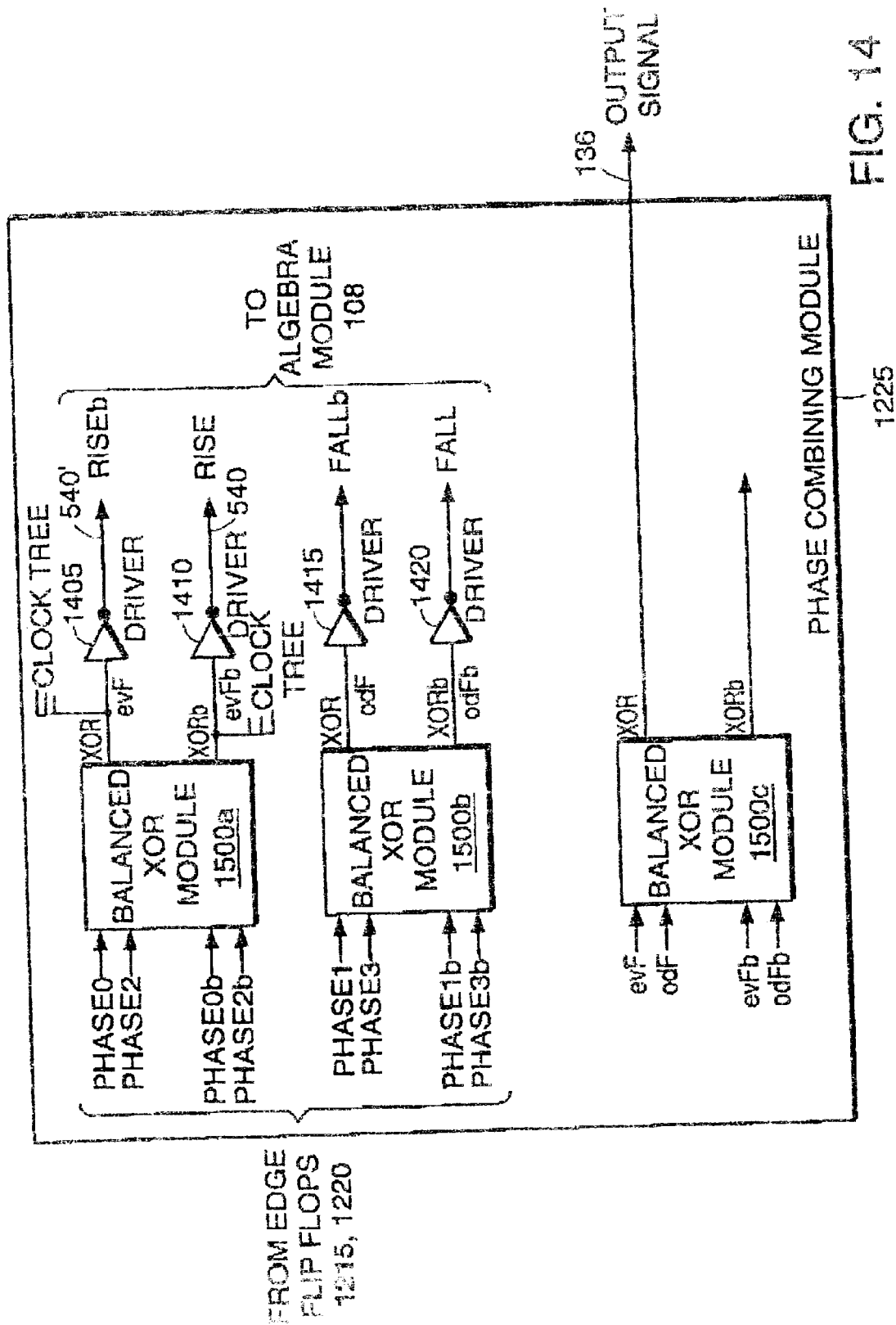
FIG. 14 is a detailed block diagram of one embodiment of the phase combining module shown in FIG. 12.

Referring to FIG. 14, the phase, or channel, combining module 1225 of the output module 114 includes three balanced XOR modules 1500a, 1500b, 1500c and four inverting driver elements 1405, 1410, 1415, 1420. The outputs of the first two balanced XOR modules 1500a, 1500b are sent from the output module 114 to the algebra module 108' and are used by the algebra module 108' as the clock for calculations, as described above. The outputs are also sent to the third balanced XOR module 1500c to create the output signal 136. The first balanced XOR module 1500a receives the rising edge channel signals (i.e., phase 0, phase 2). The next balanced XOR module 1500b receives the falling edge channel signals (i.e., phase 1, phase 3). The phase combining module 1225 is used to combine each of the signals (i.e., phase 0, phase 1, phase 2, and phase 3). The phase combining module 1225 combines in a balanced way so that the propagation delay time from the output of the pair of edge flip flops 1215, 1220 to the output signal 136 is nearly the same regardless of the signal (i.e., phase 0, phase 1, phase 2, phase 3) or signal polarities.

Figure 15:
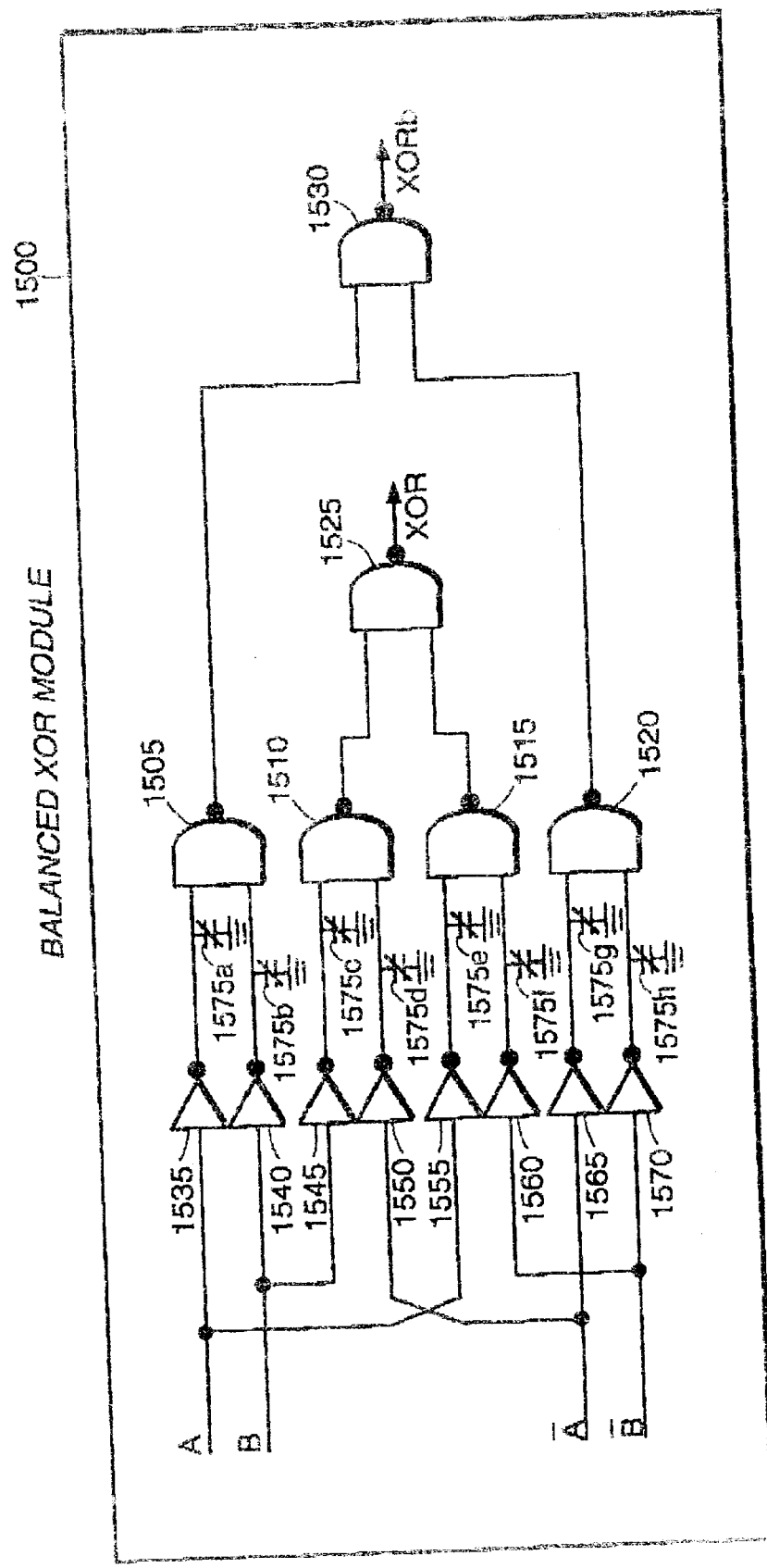
FIG. 15 is a detailed block diagram of one embodiment of the balanced XOR module shown in FIG. 14.

FIG. 15 depicts a balanced XOR module 1500 in more detail. The balanced XOR module 1500 includes six NAND elements 1505, 1510, 1515, 1520, 1525, 1530 and eight inverters 1535, 1540, 1545, 1550, 1555, 1560, 1565, 1570. The balanced XOR module 1500 also includes capacitive delay elements 1575a, 1575b, 1575c, 1575d, 1575e, 1575f, 1575g, 1575h. The capacitive delay elements 1575a, 1575b, 1575c, 1575d, 1575e, 1575f, 1575g, 1575h are different for each of the balanced XOR modules 1500a, 1500b, 1500c depicted in FIG. 14. As described above, the capacitive delay elements 1575a, 1575b, 1575c, 1575d, 1575e, 1575f, 1575g, 1575h are different to compensate for the different path lengths for each input and whether the inputs handle a rising edge or falling edge transition. Also as described above, each balanced XOR module can include a set of corresponding second capacitive delay elements 1575aa, 1575ab, 1575ac, 1575ad, 1575ae, 1575af, 1575ag, 1575ah.

Figures 16, 16A:
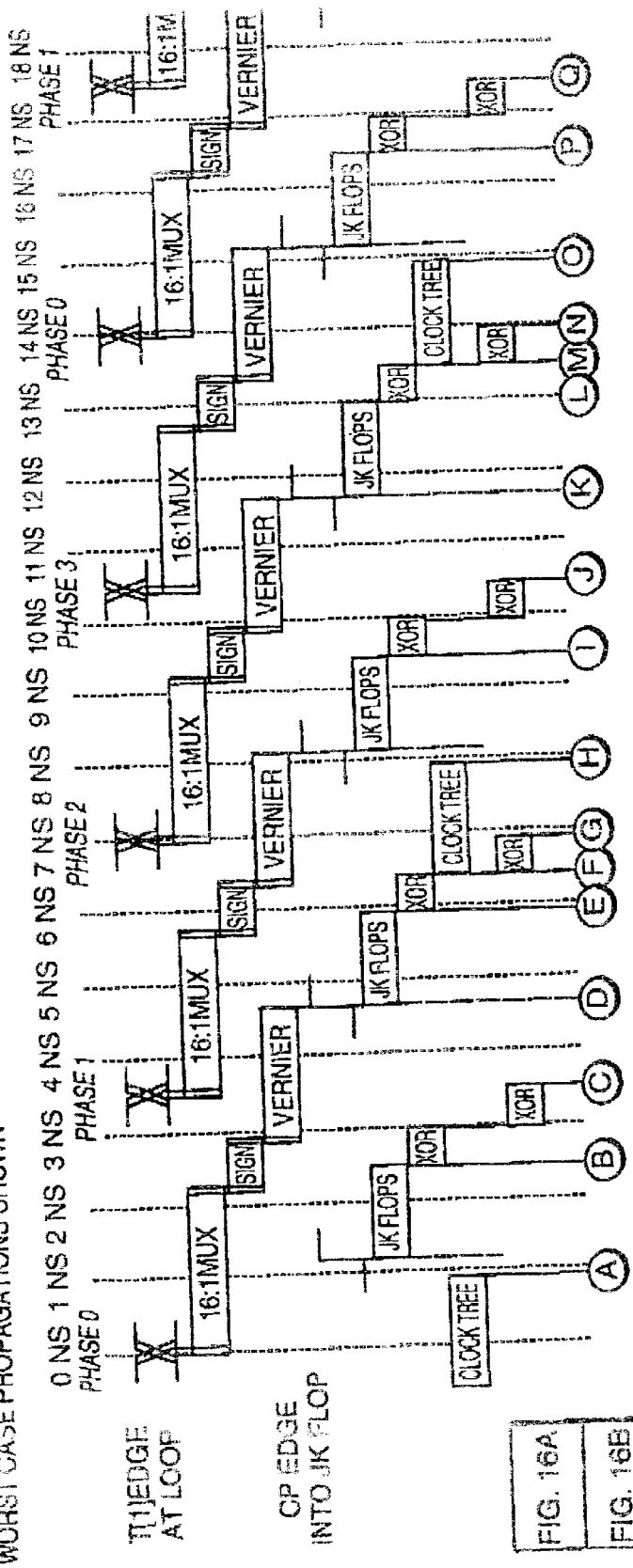
FIG. 16 is a timing diagram of signal propagation through one embodiment of the invention.
Figure 16B:
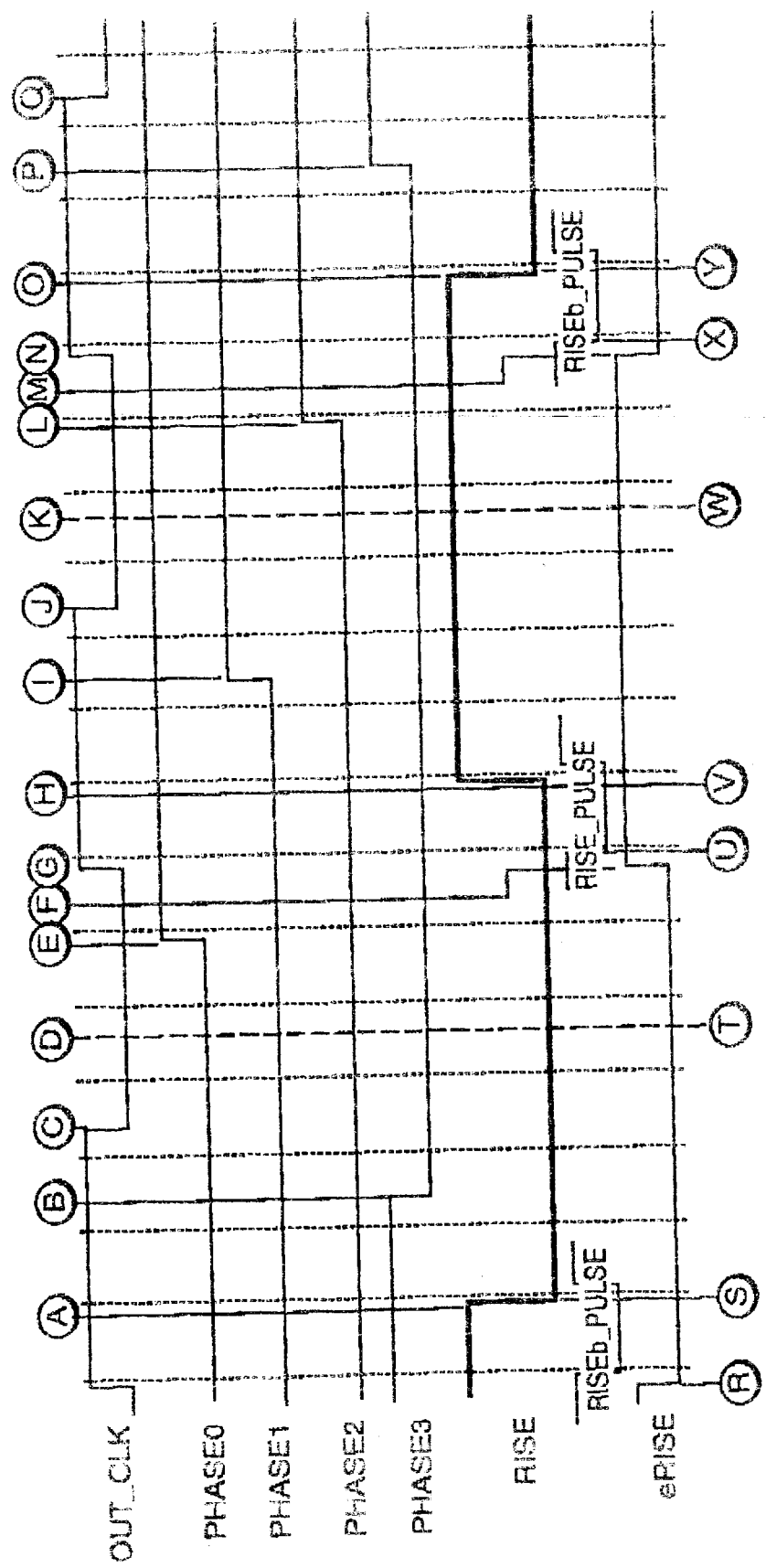
Figure 16D:
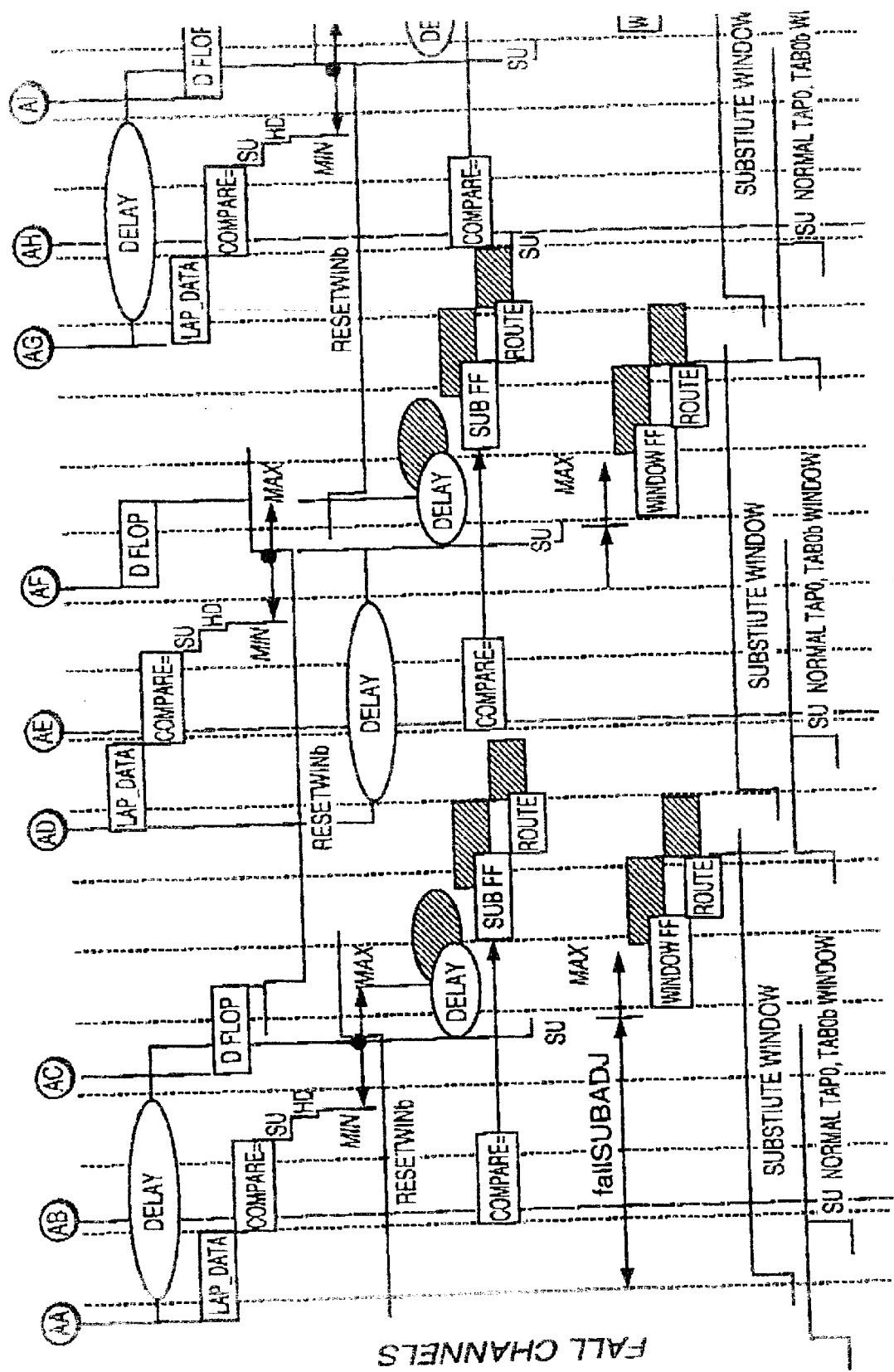

As an illustrative example, FIG. 16 depicts a timing diagram an arbitrary waveform generator 100" that outputs an output signal 136" that is a square wave with a period of seven nanoseconds (i.e., approximately 143 MHz). The timing diagram depicts an arbitrary waveform generator 100" in which an algebra module 108" contains parallel circuitry for the calculation of two alternating rising edges (i.e., phase 0 and phase 2) and two alternating falling edges (i.e., phase 1, phase 3). The timing diagram shows each signal from the input into the switching module 112" to the output of the output module 114".

The block labeled "16:1 MUX" represents the propagation time through the tap selection module (e.g., tap selection module 1003a in FIG. 10A). The block labeled "sign" represents the propagation time through the mux sign-select (e.g., mux 1010 in FIG. 10A) that selects between the positive (i.e., rising edge) tap selection module (e.g., 1003a in FIG. 10A) or the negative (i.e., falling edge) tap selection module (e.g., 1003b in FIG. 10A). The block labeled "vernier" represents the propagation time through the fine delay module (e.g., fine delay module 310 in FIG. 11). The double lines on the edge preceding the vernier block represent the variable propagation through a fine delay module 310. The block labeled "JK flops" represents the propagation time through the pair of edge flip flops (e.g., edge flip flops 1215, 1220 in FIG. 13). The block labeled "XOR" immediately subsequent to the block labeled "JK flops" represents the propagation time through the first balanced XOR module (e.g., balanced XOR module 1500a for phase 0 and phase 2 signals or balanced XOR module 1500b for phase 1 and phase 3 signals, as shown in FIG. 14). The next block labeled "XOR" immediately subsequent to the block labeled "XOR" represents the propagation time through the next balanced XOR module (e.g., balanced XOR module 1500c in FIG. 14). The block labeled "clock tree" represents the propagation time through the clock tree (e.g., clock tree shown in FIG. 14). The signal labeled "out_clk" represents the output signal 136" output by the arbitrary waveform generator 100".

Equivalents

The invention may be embodied in other specific forms without departing from the spirit or essential characteristics thereof. The foregoing embodiments are therefore to be considered in all respects illustrative rather than limiting on the invention described herein. Scope of the invention is thus indicated by the appended claims rather than by the foregoing description, and all changes which come within the meaning and range of equivalency of the claims are therefore intended to be embraced therein.

What is claimed is:

1. A waveform generator adapted to provide an internal clock that is substantially faster than a reference clock comprising:

one or more free-running ring oscillators;

one or more switching modules to receive transition edges from said oscillator, to receive transition edge information from one or more algebra modules, to select one or more of said received transition edges based on said received transition edge information, and to transmit one or more of said selected transition edges to one or more output modules;

wherein said algebra module is adapted to calculate transition information; and wherein said output module is adapted to receive said selected transition edges and to provide said selected transition edges as one or more output signals.

* * * * *